United States Patent
Bae et al.

(10) Patent No.: US 12,396,298 B2
(45) Date of Patent: Aug. 19, 2025

(54) DISPLAY DEVICE

(71) Applicant: Samsung Display Co., LTD., Yongin-si (KR)

(72) Inventors: Sung Geun Bae, Hwaseong-si (KR); Jang Soon Park, Anyang-si (KR); Jeong Hyun Lee, Anyang-si (KR); Da Sol Jeong, Seoul (KR); Won Hyeong Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 693 days.

(21) Appl. No.: 17/703,536

(22) Filed: Mar. 24, 2022

(65) Prior Publication Data
US 2023/0031785 A1    Feb. 2, 2023

(30) Foreign Application Priority Data

Jul. 27, 2021  (KR) .................. 10-2021-0098450

(51) Int. Cl.
*H10H 20/831*  (2025.01)
*H10H 20/833*  (2025.01)
(Continued)

(52) U.S. Cl.
CPC ...... *H10H 20/8312* (2025.01); *H10H 20/833* (2025.01); *H10H 20/857* (2025.01); *H10H 29/142* (2025.01)

(58) Field of Classification Search
CPC . H01L 25/0753; H01L 25/167; H10D 86/441; H10D 86/451; H10H 20/833; H10H 20/857; H10H 20/8312; H10H 29/142
(Continued)

(56) References Cited

U.S. PATENT DOCUMENTS

| 2010/0182306 A1* | 7/2010 | Kimura ................... G06F 3/038 345/213 |
| 2013/0162923 A1* | 6/2013 | Umezaki .............. G09G 3/3266 257/296 |

(Continued)

FOREIGN PATENT DOCUMENTS

| KR | 2018-0024314 | 3/2018 |
| KR | 2019-0096475 | 8/2019 |

(Continued)

OTHER PUBLICATIONS

International Search Report dated Nov. 4, 2022 for corresponding PCT Application No. PCT/KR2022/010602 (3 pages).
(Continued)

*Primary Examiner* — Fazli Erdem
(74) *Attorney, Agent, or Firm* — Womble Bond Dickinson (US) LLP

(57) ABSTRACT

A display device includes a transistor on a substrate, a via layer on the transistor, a first electrode and a second electrode on the via layer and arranged in parallel to each other, a first insulating layer on the first and second electrodes, a first bridge pattern on the first insulating layer and connected to the transistor, light-emitting elements having both end portions thereof on the first and second electrodes, a first connecting electrode connected to first end portions of the light-emitting elements, and a second connecting electrode connected to second end portions of the light-emitting elements, wherein the first connecting electrode is in contact with the first bridge pattern and is electrically connected to the transistor.

20 Claims, 20 Drawing Sheets

(51) Int. Cl.
*H10H 20/857* (2025.01)
*H10H 29/14* (2025.01)

(58) Field of Classification Search
USPC .......................................................... 257/79
See application file for complete search history.

(56) References Cited

U.S. PATENT DOCUMENTS

| | | | | |
|---|---|---|---|---|
| 2013/0328035 | A1* | 12/2013 | Okumoto | H10K 50/844 438/38 |
| 2014/0320761 | A1* | 10/2014 | Misaki | G06F 3/0446 349/12 |
| 2015/0060896 | A1* | 3/2015 | Okano | H10K 50/30 257/88 |
| 2015/0311265 | A1* | 10/2015 | Matsueda | H10K 59/353 257/89 |
| 2019/0244567 | A1* | 8/2019 | Cho | G09G 3/3233 |
| 2021/0143137 | A1* | 5/2021 | Kim | H01L 25/0753 |
| 2021/0151539 | A1 | 5/2021 | Yun et al. | |
| 2021/0350746 | A1 | 11/2021 | Cho et al. | |
| 2022/0068901 | A1 | 3/2022 | Kong et al. | |
| 2022/0310881 | A1 | 9/2022 | Bae et al. | |

FOREIGN PATENT DOCUMENTS

| | | |
|---|---|---|
| KR | 2019-0121894 A | 10/2019 |
| KR | 2020-0073340 | 6/2020 |
| KR | 2021-0057891 | 5/2021 |
| KR | 2021-0060692 | 5/2021 |
| KR | 2022-0135287 | 10/2022 |

OTHER PUBLICATIONS

Written Opinion dated Nov. 4, 2022 for corresponding PCT Application No. PCT/KR2022/010602 (4 pages).

* cited by examiner

DISPLAY DEVICE

CROSS-REFERENCE TO RELATED APPLICATION

This application claims priority to and the benefit of Korean Patent Application No. 10-2021-0098450, filed on Jul. 27, 2021, the entire disclosure of which is incorporated by reference herein.

BACKGROUND

1. Field

The present disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

Typically, a display device, which displays an image, includes a display panel such as an OLED display panel or an LCD panel. The display panel, particularly, a light-emitting element display panel, may include light-emitting elements. For example, light-emitting diodes (LEDs) may include OLEDs using an organic material as a light-emitting material and inorganic light-emitting diodes (ILEDs) using an inorganic material as a light-emitting material.

SUMMARY

One or more embodiments of the present disclosure provide a display device capable of reducing the contact resistance between electrodes and wires and preventing or reducing a galvanic phenomenon.

However, the present disclosure is not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, a display device includes a transistor on a substrate, a via layer on the transistor, a first electrode and a second electrode on the via layer and arranged in parallel to each other, a first insulating layer on the first and second electrodes, a first bridge pattern on the first insulating layer and connected to the transistor, light-emitting elements having both end portions thereof on the first and second electrodes, a first connecting electrode connected to first end portions of the light-emitting elements, and a second connecting electrode connected to second end portions of the light-emitting elements, wherein the first connecting electrode is in contact with the first bridge pattern and is electrically connected to the transistor.

In one or more embodiments, the display device further includes a bank defining an emission area, in which the light-emitting elements are located, and a subarea, which is spaced in one direction from the emission area, wherein the first and second electrodes extend from the emission area to the subarea.

In one or more embodiments, the display device further includes a second bridge pattern on the first insulating layer, in a subarea of the display device.

In one or more embodiments, the display device further includes a first conductive pattern on the substrate and connected to the transistor, a first voltage line at a same layer as the first conductive pattern and connected to the first electrode, and a second voltage line at the same layer as the first voltage line and connected to the second electrode.

In one or more embodiments, the first bridge pattern includes a first bridge extension, which overlaps with the subarea and a bank of the display device, and a second bridge extension, which is bent, and extends, in one direction from the first bridge extension.

In one or more embodiments, the first bridge extension of the first bridge pattern is in contact with the first connecting electrode, in the subarea, and the second bridge extension of the first bridge pattern is in contact with the first conductive pattern.

In one or more embodiments, the second bridge extension of the first bridge pattern is in contact with the first conductive pattern through a first contact hole, which penetrates the first insulating layer and the via layer, and the second bridge pattern is in contact with the second voltage line through a second contact hole, which penetrates the first insulating layer and the via layer.

In one or more embodiments, the second connecting electrode and the second bridge pattern are in contact with each other in the subarea, and the second bridge pattern is in contact with the second voltage line, in the subarea.

In one or more embodiments, the first connecting electrode includes a first extension, which extends in one direction in an emission area of the display device, a second extension, which extends from the emission area to the subarea, and a first connector, which connects the first and second extensions, and the second connecting electrode includes a third extension, which extends in the one direction in the emission area, a fourth extension, which extends from the emission area to the subarea, and a second connector, which connects the third and fourth extensions.

In one or more embodiments, the second extension of the first connecting electrode is in contact with the first bridge pattern, and the fourth extension of the second connecting electrode is in contact with the second bridge pattern.

In one or more embodiments, the first and second bridge patterns include a metal having a standard reduction potential difference of 0.5 V or less with indium tin oxide (ITO).

In one or more embodiments, the metal includes at least one of molybdenum (Mo), a molybdenum alloy, titanium (Ti), and a titanium alloy.

In one or more embodiments, the first and second bridge patterns include a molybdenum-niobium (Nb) alloy, and the first and second connecting electrodes include indium tin oxide.

According to one or more embodiments of the present disclosure, the display device includes a transistor on a substrate, a first conductive pattern connected to the transistor, at least one voltage line at a same layer as the first conductive pattern, a via layer on the first conductive pattern and the at least one voltage line, a first electrode and a second electrode on the via layer and arranged in parallel to each other, a first insulating layer on the first and second electrodes, a first bridge pattern on the first insulating layer and connected to the first conductive pattern, a second bridge pattern on the first insulating layer and connected to the at least one voltage line, light-emitting elements having both end portions thereof on the first and second electrodes, a first connecting electrode connected to first end portions of the light-emitting elements, and a second connecting electrode connected to second end portions of the light-emitting elements, wherein the first connecting electrode is connected to the first bridge pattern, and wherein the second connecting electrode is connected to the second bridge pattern.

In one or more embodiments, the display device further includes a bank defining an emission area, in which the light-emitting elements are located, and a subarea, which is spaced in one direction from the emission area, wherein the first bridge pattern overlaps with the bank, but not with the emission area and the subarea, and the second bridge pattern overlaps with the subarea, but not with the emission area and the bank.

In one or more embodiments, the first connecting electrode includes a first extension, which extends in the one direction in the emission area, and a first connector, which extends from one end of the first extension to overlap with the bank, and the first connector of the first connecting electrode is in contact with the first bridge pattern through a contact hole, which penetrates the bank.

In one or more embodiments, the first connecting electrode includes a first extension, which extends in the one direction in the emission area, a second extension, which extends from the emission area to the subarea, and a first protrusion, which extends from one end of the second extension to overlap with the bank, and the first protrusion of the first connecting electrode is in contact with the first bridge pattern through a contact hole, which penetrates the bank.

In one or more embodiments, the first and second bridge patterns include a metal having a standard reduction potential difference of 0.5 V or less with indium tin oxide.

In one or more embodiments, the metal includes at least one of molybdenum, a molybdenum alloy, titanium, and a titanium alloy.

In one or more embodiments, the display device further includes a second insulating layer on the light-emitting elements, wherein the first connecting electrode is on one side surface of the second insulating layer, and the second connecting electrode is on the other side surface of the second insulating layer.

According to the aforementioned and other embodiments of the present disclosure, the contact resistance between connecting electrodes and bridge patterns may be reduced by connecting first and second connecting electrodes to a first conductive pattern and a second voltage line, respectively, using the bridge patterns.

Also, a galvanic phenomenon that may occur between the connecting electrodes and the bridge patterns may be prevented by placing the bridge patterns, which include a metal having a standard reduction potential difference of ±0.5 V with ITO, in contact with the connecting electrodes.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which one or more embodiments of the present disclosure are shown. This disclosure may, however, be embodied in different forms and should not be construed as limited to the embodiments set forth herein. Rather, these embodiments are provided so that this disclosure will be thorough and complete, and will fully convey the features and scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Embodiments of the present disclosure will hereinafter be described with reference to the accompanying drawings.

Figure 1:
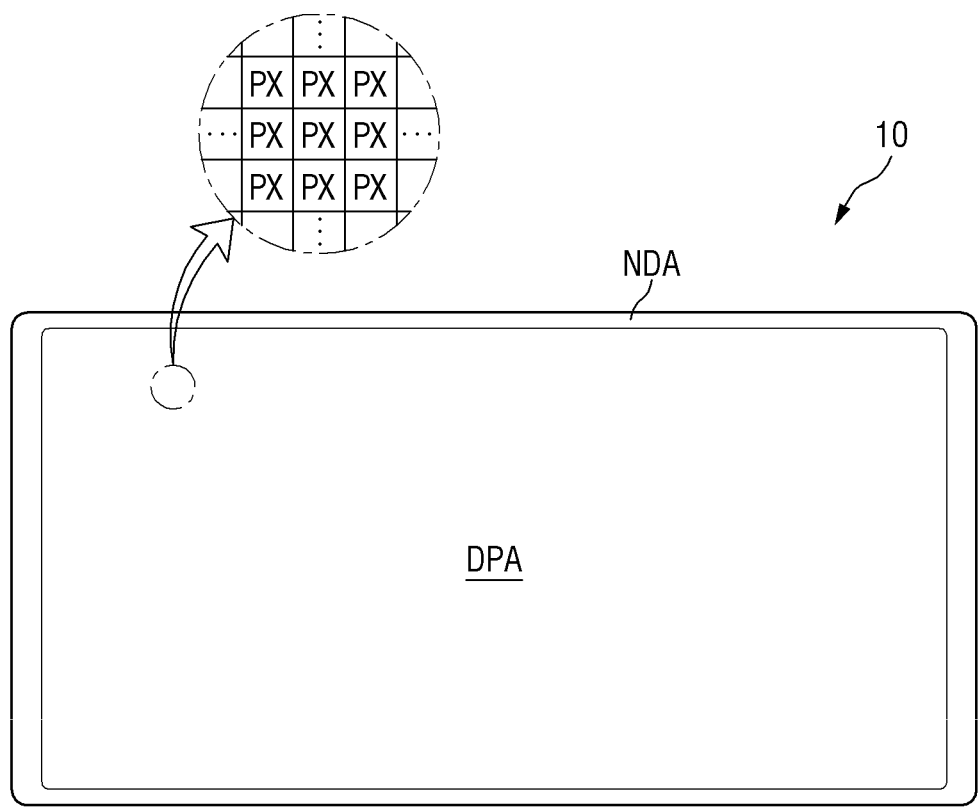
FIG. 1 is a plan view of a display device according to one or more embodiments of the present disclosure.

FIG. 1 is a plan view of a display device according to one or more embodiments of the present disclosure.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the present disclosure is not limited thereto. That is, various other display panels are also applicable to the display panel of the display device 10.

First, second, and third directions DR1, DR2, and DR3 are as defined in the drawings of the display device 10. The first and second directions DR1 and DR2 may be orthogonal to each other on a single plane. The third direction DR3 may be orthogonal to the plane where the first and second directions DR1 and DR2 reside. The third direction DR3 may be orthogonal to both the first and second directions DR1 and DR2. The third direction DR3 may refer to the thickness direction of the display device 10.

The shape of the display device 10 may vary. For example, the display device 10 may have a rectangular shape extending longer in the first direction DR1 than in the second direction DR2. In another example, the display device 10 may have a rectangular shape extending longer in the second direction DR2 than in the first direction DR1. However, the present disclosure is not limited to these examples. That is, the display device 10 may have various other shapes such as a square shape, a tetragonal shape with rounded corners, a non-tetragonal polygonal shape, or a circular shape. The shape of the display area DPA of the display device 10 may be similar to the shape of the display device 10. FIG. 1 illustrates that the display device 10 and the display area DPA both have a rectangular shape extending longer in the first direction DR1 than in the second direction DR2.

The display device 10 may include the display area DPA and a non-display area NDA. The display area DPA may be an area in which an image is displayed, and the non-display area NDA may be an area in which an image is not displayed. The display area DPA may also be referred to as an active area, and the non-display area NDA may also be referred to as an inactive area. The display area DPA may occupy the middle (or central) portion of the display device 10 and the non-display area NDA may be around the edge or periphery of the display area DPA.

The display area DPA may include a plurality of pixels PX. The pixels PX may be arranged in row and column directions. For example, the pixels PX may be arranged along rows and columns of a matrix. The pixels PX may have a rectangular or square shape in a plan view, but the present disclosure is not limited thereto. Alternatively, the pixels PX may have a rhombus shape having sides that are inclined with respect to a particular direction. The pixels PX may be alternately arranged in a stripe or a PENTILE™ arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX may include one or more light-emitting elements emitting light of a particular wavelength range and may thus display a particular color.

The non-display area NDA may be disposed around the display area DPA. The non-display area NDA may surround the entire display area DPA or portion of the display area DPA along the edge or periphery of the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
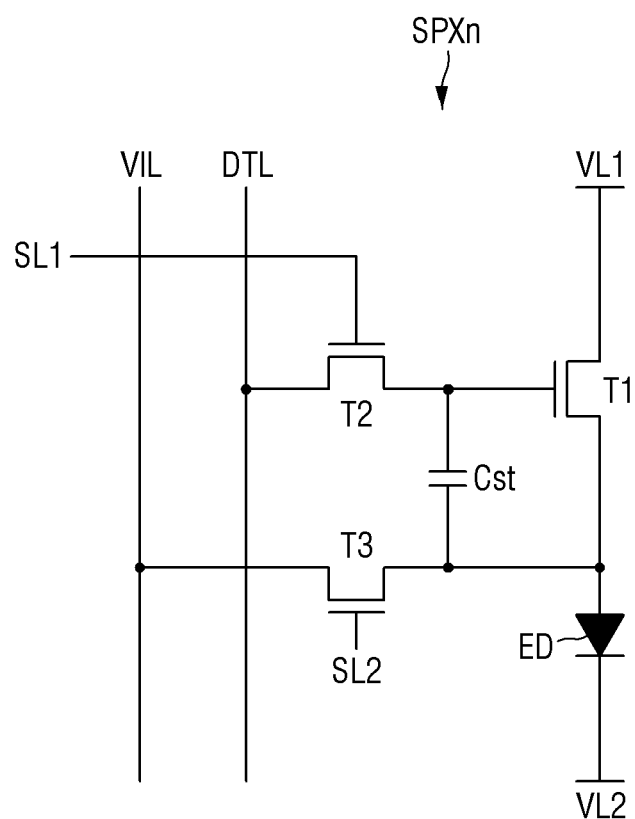
FIG. 2 is an equivalent circuit diagram of a subpixel of the display device of FIG. 1.

FIG. 2 is an equivalent circuit diagram of a subpixel of the display device of FIG. 1.

Referring to FIG. 2, a subpixel SPXn of the display device 10 may include a light-emitting element ED, three transistors (i.e., first, second, and third transistors T1, T2, and T3), and one storage capacitor Cst.

The light-emitting element ED emits light in accordance with a current supplied thereto via the first transistor T1. The light-emitting element ED may emit light of a particular wavelength range based on electrical signals received from first and second electrodes that both ends of the light-emitting element are connected to.

A first end of the light-emitting element ED may be connected to the source electrode of the first transistor T1, and a second end of the light-emitting element ED may be connected to a second voltage line VL2. A high-potential voltage or a first power supply voltage may be supplied to a first voltage line VL1, and a low-potential voltage or a second power supply voltage, which is lower than the first power supply voltage, may be supplied to the second voltage line VL2.

The first transistor T1 may control a current flowing from the first voltage line VL1 into the light-emitting element ED, in accordance with the difference in voltage between the gate electrode and the source electrode of the first transistor T1. For example, the first transistor T1 may be a driving transistor for driving the light-emitting element ED. The gate electrode of the first transistor T1 may be connected to the source electrode of the second transistor T2, the source electrode of the first transistor T1 may be connected to the first end of the light-emitting element ED, and the drain electrode of the first transistor T1 may be connected to the first voltage line VL1.

The second transistor T2 is turned on by a scan signal (e.g., a scan signal having a gate-on voltage or high level voltage) from a first scan line SL1 to connect a data line DTL to the gate electrode of the first transistor T1. The gate electrode of the second transistor T2 may be connected to the first scan line SL1, the source electrode of the second transistor T2 may be connected to the gate electrode of the first transistor T1, and the drain electrode of the second transistor T2 may be connected to the data line DTL.

The third transistor T3 is turned on by a scan signal (e.g., a scan signal having a gate-on voltage or high level voltage) from a second scan line SL2 to connect an initialization voltage line VIL to the first end of the light-emitting element ED. The gate electrode of the third transistor T3 may be connected to the second scan line SL2, the drain electrode of the third transistor T3 may be connected to the initialization voltage line VIL, and the source electrode of the third transistor T3 may be connected to the first end of the light-emitting element ED or the source electrode of the first transistor T1. The first and second scan lines SL1 and SL2 are illustrated as being separate lines, but the present disclosure is not limited thereto. Alternatively, the first and second scan lines SL1 and SL2 may be incorporated into a single scan line, in which case, the second and third transistors T2 and T3 may be turned on at the same time by the same scan signal.

The source electrodes and the drain electrodes of the first, second, and third transistors T1, T2, and T3 are not limited to the above descriptions. The first, second, and third transistors T1, T2, and T3 may be formed as thin-film transistors (TFTs). FIG. 2 illustrates that the first, second, and transistors T1, T2, and T3 are formed as N-type metal-oxide semiconductor field-effect transistors (MOSFETs), but the present disclosure is not limited thereto. Alternatively, the first, second, and third transistors T1, T2, and T3 may be formed as P-type MOSFETs. Yet alternatively, some of the first, second, and third transistors T1, T2, and T3 may be formed as N-type MOSFETs, and some of the first, second, and third transistors T1, T2, and T3 may be formed as P-type MOSFETs.

The storage capacitor Cst is formed between the gate electrode and the source electrode of the first transistor T1. The storage capacitor Cst stores a differential voltage between the gate electrode and the source electrode of the first transistor T1.

The structure of a pixel PX of the display device 10 will hereinafter be described.

Figure 3:
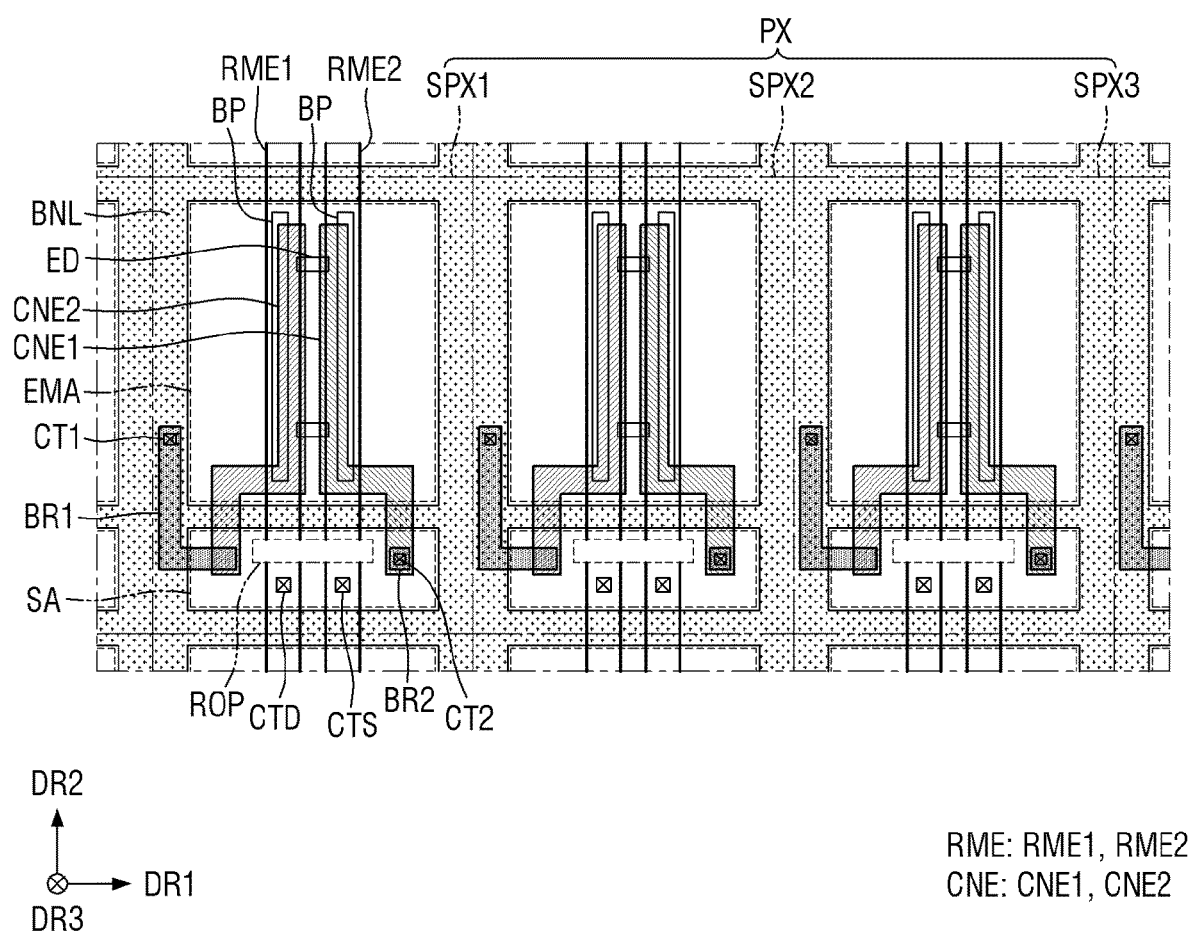
FIG. 3 is a plan view of a pixel of the display device of FIG. 1.

FIG. 3 is a plan view of a pixel of the display device of FIG. 1.

Referring to FIG. 3, a pixel PX may include a plurality of subpixels SPXn (where n is an integer of 1 to 3). For example, the pixel PX may include first, second, and third subpixels SPX1, SPX2, and SPX3. The first, second, and third subpixels SPX1, SPX2, and SPX3 may emit light of first, second, and third colors, respectively. For example, the first, second, and third colors may be blue, green, and red, respectively, but the present disclosure is not limited thereto. Alternatively, the first, second, and third subpixels SPX1, SPX2, and SPX3 may emit light of the same color. FIG. 3 illustrates that the pixel PX includes three subpixels SPXn, but the pixel PX may include more than three subpixels SPXn.

Each of the subpixels SPXn of the pixel PX may include an emission area EMA and a non-emission area. The emission area EMA may be an area where an array of light-emitting elements ED is disposed and emit light, and the non-emission area may be an area that is not reached by light emitted from the array of light-emitting elements ED and thus does not output light. The emission area EMA may include the area where the array of light-emitting elements ED is disposed and an area around the array of light-emitting elements ED that outputs light emitted from the array of light-emitting elements ED.

However, the present disclosure is not limited to this. Alternatively, the emission area EMA may also include an area that outputs light emitted from the array of light-emitting elements ED and then reflected or refracted by other members. A plurality of light-emitting elements ED may be disposed in each of the subpixels SPXn, and the emission area EMA may be configured to include an area where the plurality of light-emitting elements ED are disposed and an area around the plurality of light-emitting elements ED.

Each of the subpixels SPXn may further include a subarea SA, which is disposed in the non-emission area. The subarea SA may be disposed on a side, in the second direction DR2, of the emission area EMA. The subarea SA may be disposed between emission areas EMA of two adjacent subpixels SPXn in the second direction DR2. In the display area DPA of the display device 10, a plurality of emission areas EMA and a plurality of subareas SA may be arranged. For example, the plurality of emission areas EMA or the plurality of subareas SA may be arranged repeatedly along the first direction DR1, and the plurality of emission areas EMA and the plurality of subareas SA may be alternately arranged along the second direction DR2. The distance, in the first direction DR1, between the plurality of subareas SA may be the same as the distance, in the first direction DR1, between the plurality of emission areas EMA. A bank BNL may be disposed between the plurality of subareas SA and between the plurality of emission areas EMA, and the distances between the plurality of subareas SA and between the plurality of emission areas EMA may vary depending on the width of the bank BNL therebetween. In each of the subpixels SPXn, the subarea SA does not output light due to the absence of light-emitting elements ED therein, and portions of the electrodes RME may be disposed in the subarea SA. Electrodes RME of one subpixel SPXn may be separated from electrodes RME of another subpixel SPXn adjacent in the second direction DR2 in the subarea SA of the former subpixel SPXn.

The subarea SA of each of the subpixels SPXn may include a separation part ROP. The separation part ROP may be an area where electrodes RME of the pixel PX are separated from electrodes RME of a neighboring pixel PX, in the second direction DR2, of the pixel PX.

Figure 4:
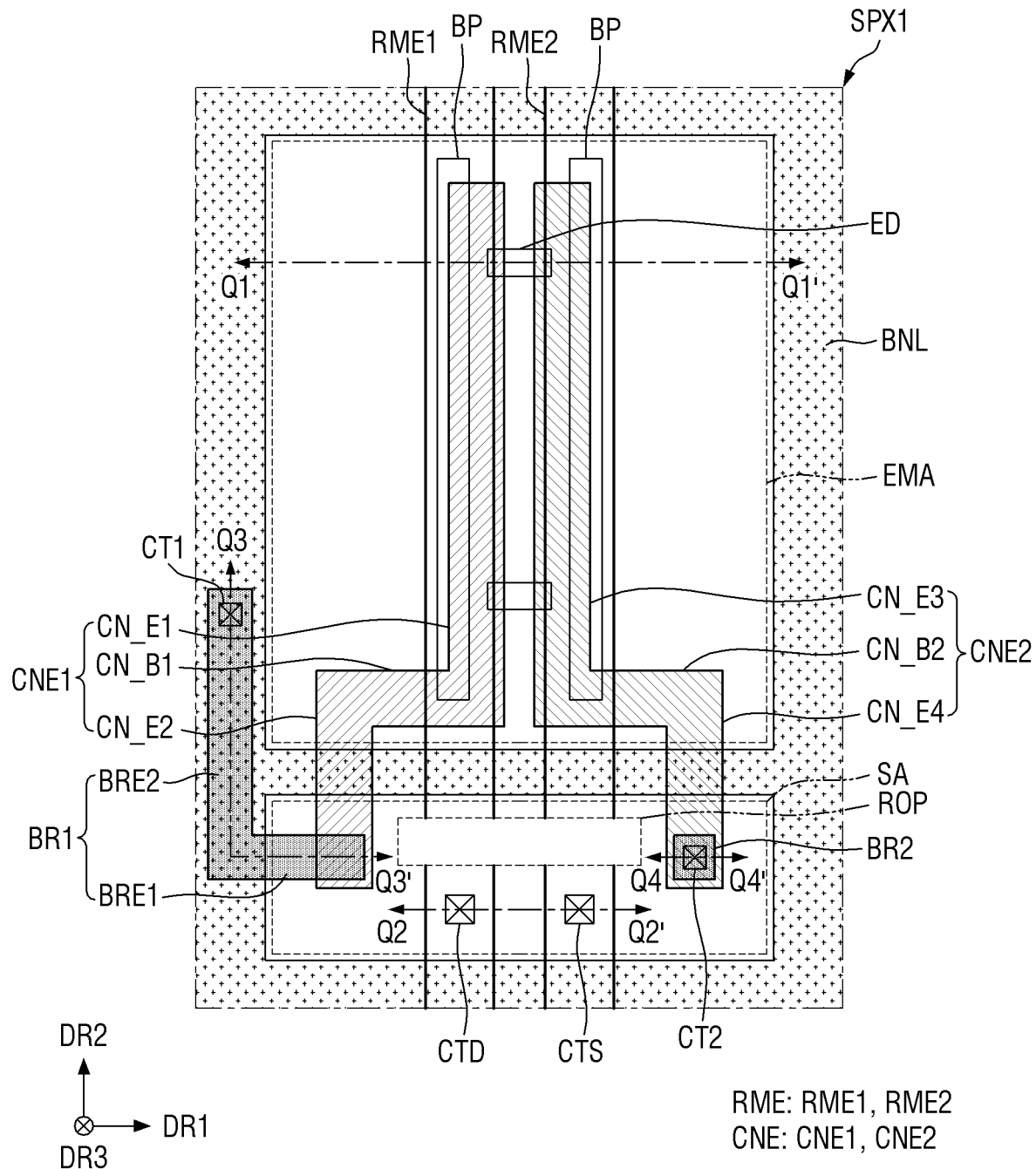
FIG. 4 is a plan view of a first subpixel according to one or more embodiments of the present disclosure.
Figure 5:
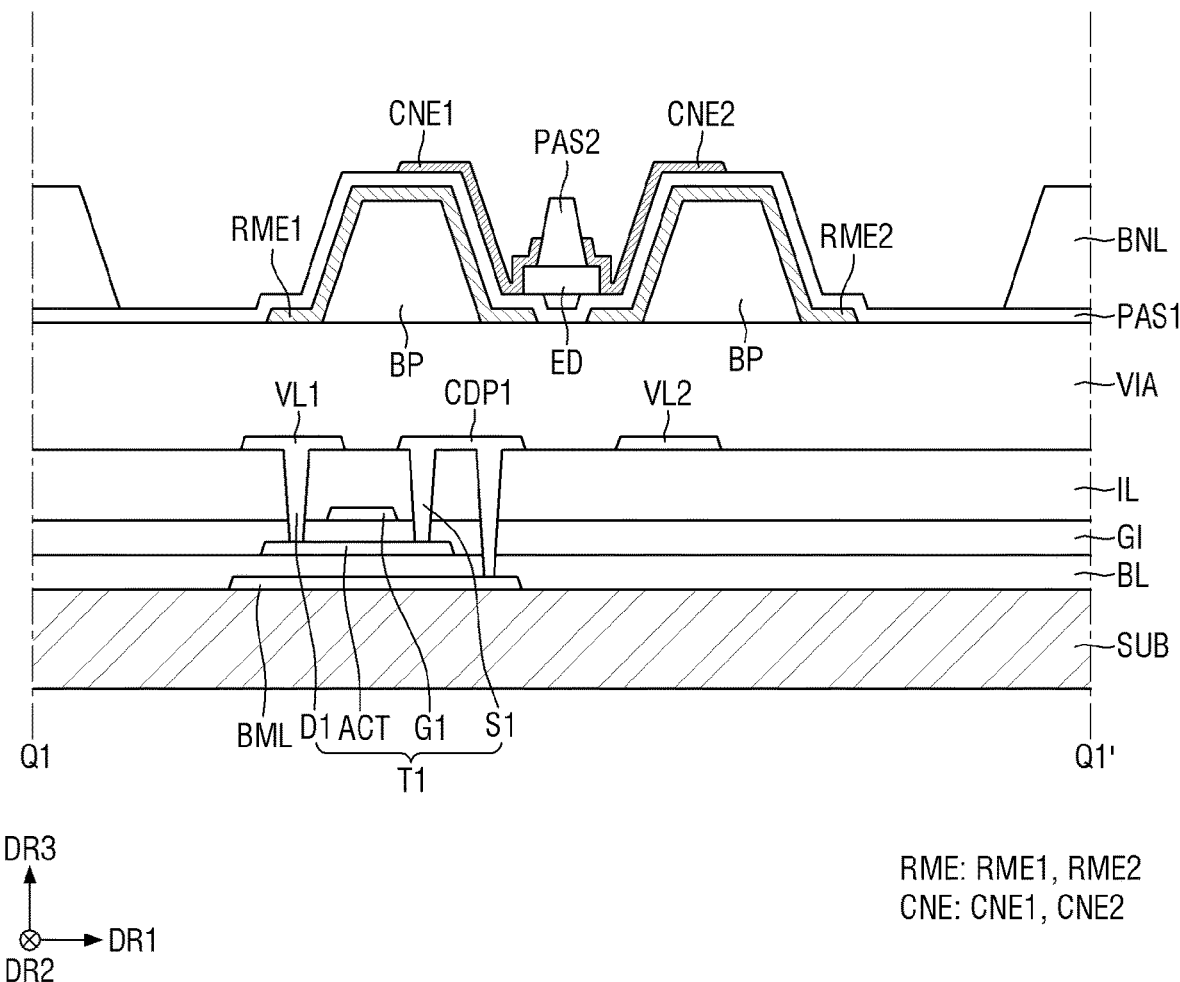
FIG. 5 is a cross-sectional view taken along the line Q1-Q1' of FIG. 4.
Figure 6:
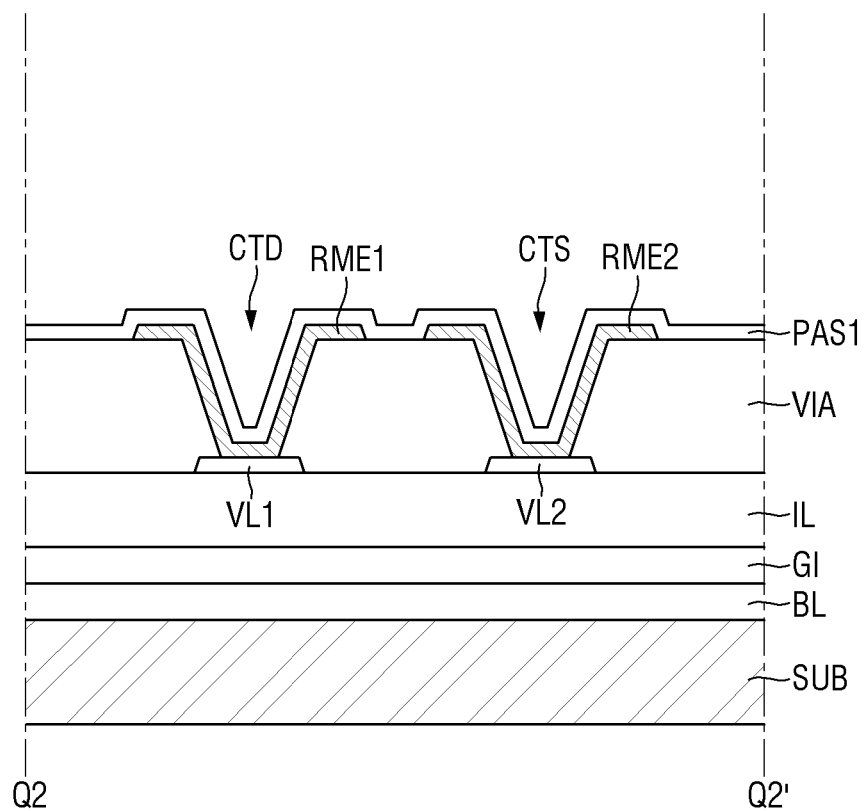
FIG. 6 is a cross-sectional view taken along the line Q2-Q2' of FIG. 4.
Figure 7:
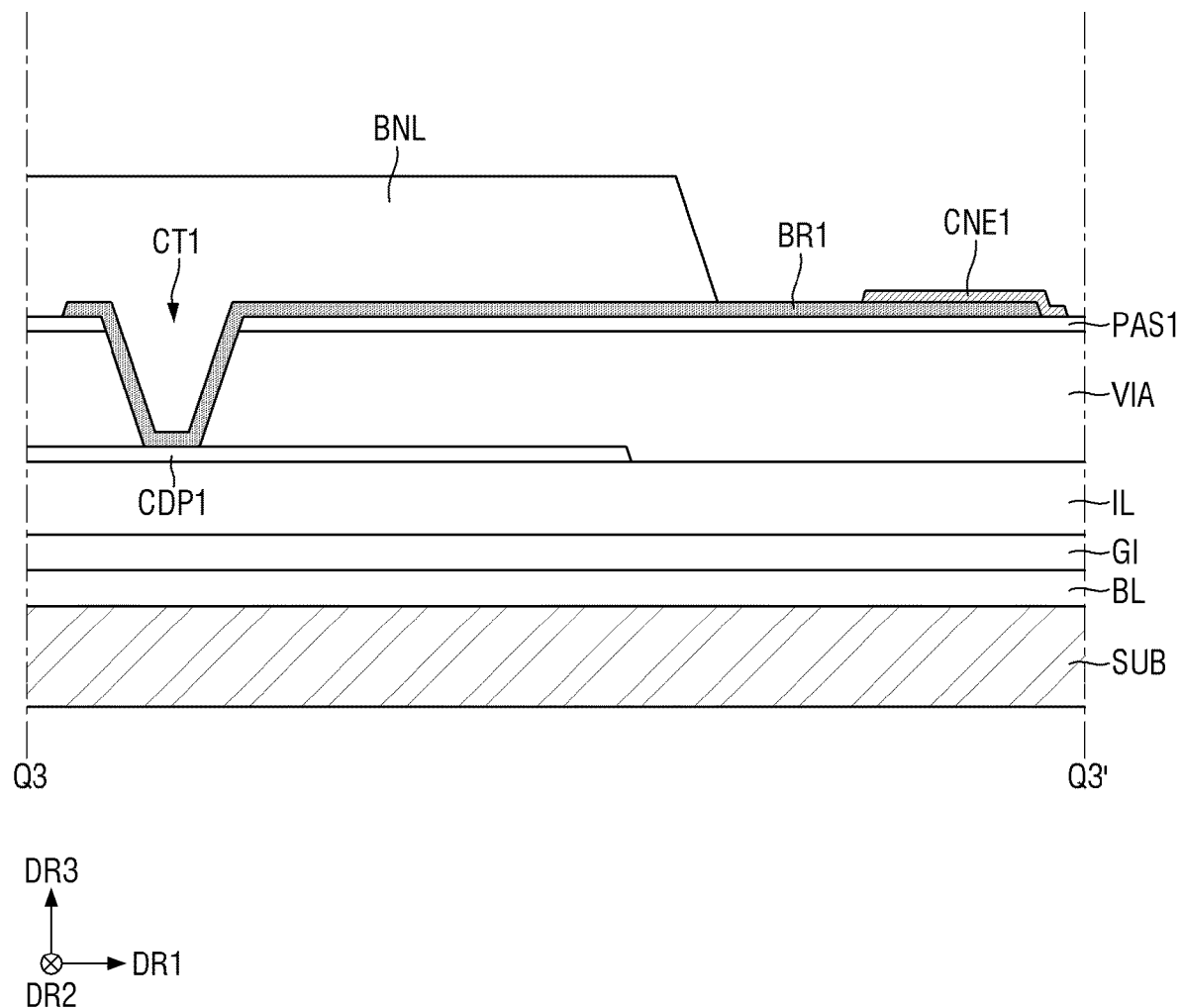
FIG. 7 is a cross-sectional view taken along the line Q3-Q3' of FIG. 4.
Figure 8:
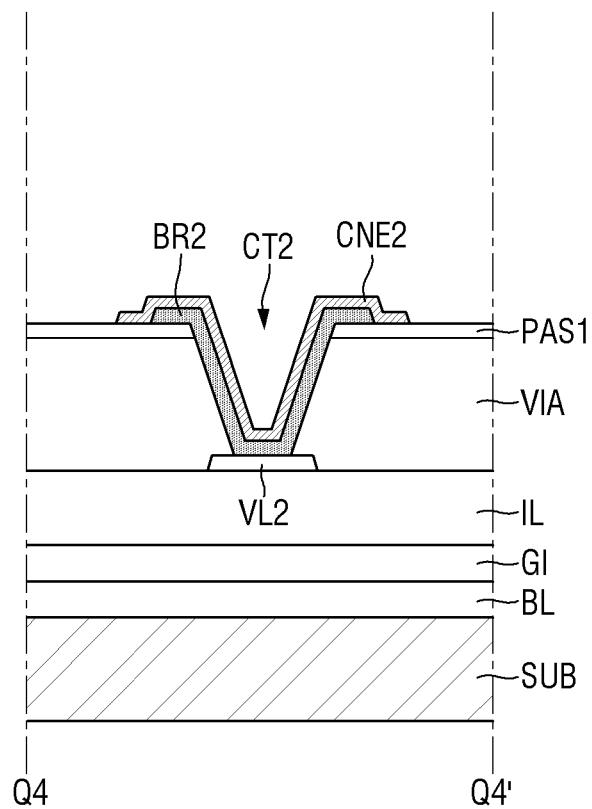
FIG. 8 is a cross-sectional view taken along the line Q4-Q4' of FIG. 4.

FIG. 4 is a plan view of a first subpixel according to one or more embodiments of the present disclosure. FIG. 5 is a cross-sectional view taken along the line Q1-Q1' of FIG. 4. FIG. 6 is a cross-sectional view taken along the line Q2-Q2' of FIG. 4. FIG. 7 is a cross-sectional view taken along the line Q3-Q3' of FIG. 4. FIG. 8 is a cross-sectional view taken along the line Q4-Q4' of FIG. 4.

Referring to FIGS. 4 through 7, the display device 10 may include, in the first subpixel SPX1, a substrate SUB and a semiconductor layer, a plurality of conductive layers, and a plurality of insulating layers, which are disposed on the substrate SUB. The semiconductor layer, the conductive layers, and the insulating layers may form a circuit layer and a light-emitting element layer of the display device 10.

In one or more embodiments, the substrate SUB may be an insulating substrate. The substrate SUB may be formed of an insulating material such as glass, quartz, or a polymer resin. The substrate SUB may be a rigid substrate or may be a flexible substrate that is bendable, foldable, and/or rollable.

A first conductive layer may be disposed on the substrate SUB. The first conductive layer includes a lower metal layer BML, and the lower metal layer BML is disposed to overlap with an active layer ACT of a first transistor T1 in the third direction DR3. The lower metal layer BML may include a material capable of blocking the transmission of light and may prevent light from being incident upon the active layer ACT of the first transistor T1. For example, the lower metal layer BML may be formed of an opaque metallic material capable of blocking the transmission of light, but the present disclosure is not limited thereto. In one or more embodiments, the lower metal layer BML may not be provided.

A buffer layer BL may be disposed on the entire surface of the lower metal layer BML and on the substrate SUB. The buffer layer BL may be formed on the substrate SUB to protect the transistors of the first subpixel SPX1 from moisture that may penetrate through the substrate SUB, which is vulnerable to moisture, and may perform a surface planarization function. The buffer layer BL may be formed of a plurality of inorganic layers that are alternately stacked. For example, the buffer layer BL may be formed as a multilayer in which inorganic layers of at least one of silicon oxide ($SiO_x$), silicon nitride ($SiN_x$), and silicon oxynitride ($SiO_xN_y$) are alternately stacked.

A semiconductor layer may be disposed on the buffer layer BL. The semiconductor layer may include the active layer ACT of the first transistor T1. The active layer ACT is disposed on the buffer layer BL. The active layer ACT may be disposed to partially overlap with a gate electrode G1 of a second conductive layer that will be described later in the third direction DR3.

The semiconductor layer may include polycrystalline silicon, monocrystalline silicon, or an oxide semiconductor. Alternatively, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 4 through 8 illustrate that the first subpixel SPX1 includes only one transistor, i.e., the first transistor T1, but the present disclosure is not limited thereto. That is, the first subpixel SPX1 may include more than one transistor.

A first gate insulating layer GI is disposed on the active layer ACT and the buffer layer BL on the substrate SUB. The first gate insulating layer GI may function as a gate insulating film for the first transistor T1. The gate insulating layer GI may function as the gate insulating film of each transistor of the first subpixel SPX1. The gate insulating layer GI may be formed as an inorganic layer including an inorganic material such as, for example, $SiO_x$, $SiN_x$, or $SiO_xN_y$, or as a stack of such inorganic layers.

A second conductive layer is disposed on the first gate insulating layer GI. The second conductive layer may include a gate electrode G1 of the first transistor T1. The gate electrode G1 may be disposed to overlap with the channel region of the active layer ACT in a thickness direction, i.e., in a third direction DR3.

The second conductive layer may be formed as a single- or multilayer including molybdenum (Mo), aluminum (Al), chromium (Cr), gold (Au), titanium (Ti), nickel (Ni), neodymium (Nd), copper (Cu), or an alloy thereof, but the present disclosure is not limited thereto.

An interlayer insulating layer IL may be disposed on the second conductive layer. The interlayer insulating layer IL may function as an insulating film between the second conductive layer and layers disposed above the second conductive layer. The interlayer insulating layer IL may be disposed to cover and protect the second conductive layer. The interlayer insulating layer IL may be formed as an inorganic layer including an inorganic material such as, for example, $SiO_x$, $SiN_x$, or $SiO_xN_y$, or as a stack of such inorganic layers.

A third conductive layer is disposed on the interlayer insulating layer IL. The third conductive layer may include a source electrode S1 and a drain electrode D1 of the first transistor T1, a first voltage line VL1, a second voltage line VL2, and a first conductive pattern CDP1.

A high-potential voltage (or a first power supply voltage) to be delivered to a first electrode RME1 may be applied to the first voltage line VL1, and a low-potential voltage (or a second power supply voltage) to be delivered to a second electrode RME2 may be applied to the second voltage line VL2. Portion of the first voltage line VL1 may be in contact with the active layer ACT of the first transistor T1 through a contact hole that penetrates the interlayer insulating layer IL and the first gate insulating layer GI. The first voltage line VL1 may function as a drain electrode D1 of the first transistor T1. The first voltage line VL1 may be directly connected to the first electrode RME1. The second voltage line VL2 may be directly connected to the second electrode RME2.

The first conductive pattern CDP1 may be in contact with the active layer ACT of the first transistor T1 through a contact hole that penetrates the interlayer insulating layer IL and the first gate insulating layer GI. Also, the first conductive pattern CDP1 may be in contact with the lower metal layer BML through another contact hole that penetrates through the interlayer insulating layer IL, the first gate insulating layer GI, and the buffer layer BL. The first conductive pattern CDP1 may function as the source electrode S1 of the first transistor T1.

The third conductive layer may be formed as a single- or multilayer including Mo, Al, Cr, Au, Ti, Ni, Nd, Cu, or an alloy thereof, but the present disclosure is not limited thereto.

A via layer VIA is disposed on the third conductive layer and the interlayer insulating layer IL. The via layer VIA may include an organic insulating material such as, for example, PI, and may perform a surface planarization function.

A plurality of electrodes RME, a plurality of bank patterns BP, a bank BNL, a plurality of light-emitting elements ED, and a plurality of connecting electrodes CNE may be disposed on the via layer VIA. A plurality of first and second insulating layers PAS1 and PAS2 may be disposed on the via layer VIA. In one or more embodiments, a third insulating layer may also be disposed on the via layer VIA and the first and second insulating layers PAS1 and PAS2.

The bank patterns BP may be disposed directly on the via layer VIA. The bank patterns BP may extend in the second direction DR2 within the first subpixel SPX1, but not into a neighboring subpixel SPXn, in the second direction DR2, of the first subpixel SPX1 (or an upper neighboring subpixel SPXn of the first subpixel SPX1) and may be disposed within an emission area EMA of the first subpixel SPX1. The bank patterns BP may be disposed to be spaced from one another in the first direction DR1, and light-emitting elements ED may be disposed between the bank patterns BP. A plurality of bank patterns BP may be disposed in each subpixel SPXn to form linear patterns in the display area DPA of the display device 10. FIGS. 4 through 8 illustrate that two bank patterns BP are provided in the first subpixel SPX1, but the number of bank patterns BP included in each subpixel SPXn is not particularly limited. That is, more than two bank patterns BP may be provided in each subpixel SPXn, depending on the number of electrodes RME provided in each subpixel SPXn.

The bank patterns BP may protrude at least in part from the top surface of the via layer VIA. Protruding portions of the bank patterns BP may have inclined side surfaces, and light emitted from the light-emitting elements ED may be reflected by the electrodes RME to be output in an upward direction from the via layer VIA. The bank patterns BP may provide space in which the light-emitting elements ED may be disposed and may function as a reflective barrier capable of reflecting light emitted from the light-emitting elements ED in the upward direction. The side surfaces of each of the bank patterns BP may be linearly inclined, but the present disclosure is not limited thereto. Alternatively, the bank patterns BP may have a curved semicircular or semielliptical shape. The bank patterns BP may include an organic insulating material such as polyimide (PI), but the present disclosure is not limited thereto.

The electrodes RME may be disposed on the bank patterns BP and the via layer VIA. The electrodes RME may include first and second electrodes RME1 and RME2. The first and second electrodes RME1 and RME2 may extend in the second direction DR2 and may be spaced from one another in the first direction DR1.

The first and second electrodes RME1 and RME2 may extend in the second direction DR2 in the first subpixel SPX1 and may be separated from first and second electrodes RME1 and RME2 of another subpixel SPXn adjacent in the second direction DR2, in a subarea SA of the first subpixel SPX1. For example, the subarea SA of the first subpixel SPX1 may be disposed between the emission area EMA of the first subpixel SPX1 and an emission area EMA of a neighboring subpixel SPXn, in the opposite direction of the second direction DR2, of the first subpixel SPX1 (or a lower neighboring subpixel SPXn of the first subpixel SPX1), and the first and second electrodes RME1 and RME2 may be separated from first and second electrodes RME1 and RME2 of the lower neighboring subpixel SPXn, in a separation part ROP of a subarea SA of the first subpixel SPX1. However, the present disclosure is not limited thereto. Alternatively, the first and second electrodes RME1 and RME2 may be formed to continuously extend into the lower neighboring subpixel SPXn, without being cut and divided in each subpixel SPXn, or only one of the first and second electrodes RME1 and RME2 may be formed to be cut and divided in each subpixel SPXn.

The first electrode RME1 may be electrically connected to the first voltage line VL1 and the first transistor T1 through a first electrode contact hole CTD, and the second electrode RME2 may be electrically connected to the second voltage line VL2 through a second electrode contact hole CTS. For example, the first electrode RME1 may be in contact with the first voltage line VL1 through the first electrode contact hole CTD, which penetrates the via layer VIA, in the subarea SA, and the second electrode RME2 may be in contact with the second voltage line VL2 through the second electrode contact hole CTS, which penetrates the via layer VIA, in the subarea SA. However, the present disclosure is not limited to this example. In another example, the first and second electrode contact holes CTD and CTS may be disposed in an area that overlaps with the bank BNL.

The first electrode contact hole CTD may connect the first electrode RME1 and the first voltage line VL1 so that a signal for aligning the light-emitting elements ED may be applied to the first electrode RME1 through the first voltage line VL1. The second electrode contact hole CTS may connect the second electrode RME2 and the second voltage line VL2 so that the second power supply voltage may be applied to the second electrode RME2 through the second voltage line VL2. As will be described later, the first and second electrodes RME1 and RME2 may be divided in the separation part ROP after the alignment of the light-emitting elements ED and may thus receive no signals any longer from the first and second voltage lines VL1 and VL2, respectively.

FIGS. 4 through 8 illustrate that one first electrode RME1 and one second electrode RME2 are disposed in the first subpixel SPX1, but the present disclosure is not limited thereto. That is, more than one first electrode RME1 and more than one second electrode RME2 may be provided in the first subpixel SPX1. Also, the first and second electrodes RME1 and RME2 may not necessarily extend in one direction and may be arranged in various layouts. For example, the first and second electrodes RME1 and RME2 may be partially curved or bent, or one of the first and second electrodes RME1 and RME2 may be disposed to be around (or surround) the other electrode.

The first and second electrodes RME1 and RME2 may be disposed directly on the bank patterns BP. The first and second electrodes RME1 and RME2 may be formed to have a larger width in the first direction DR1 than the bank patterns BP. For example, the first and second electrodes RME1 and RME2 may be disposed to cover outer surfaces of the bank patterns BP. The first and second electrodes RME1 and RME2 may be disposed on side surfaces of the bank patterns BP, and the distance between the first and second electrodes RME1 and RME2 may be smaller than the distance between the bank patterns BP in the first direction DR1. At least portions of the first and second electrodes RME1 and RME2 may be disposed directly on the via layer VIA and may thus be placed on the same plane, but the present disclosure is not limited thereto. In one or more embodiments, the width of the first and second electrodes RME1 and RME2 may be smaller than the width of the bank patterns BP. The first and second electrodes RME1 and RME2 may be disposed to cover at least one side surface of each of the bank patterns BP and may thus reflect light emitted from the light-emitting elements ED.

The first and second electrodes RME1 and RME2 may include a conductive material with high reflectance. For example, the first and second electrodes RME1 and RME2 may include a metal such as silver (Ag), Cu, or Al or an alloy of Al, Ni, or lanthanum (La). The first and second electrodes RME1 and RME2 may reflect light, traveling toward the side surfaces of the bank patterns BP after emitted from the light-emitting elements ED, in the upward direction.

However, the present disclosure is not limited to this example. In another example, the first and second electrodes RME1 and RME2 may include a material such as indium tin oxide (ITO), indium zinc oxide (IZO), or indium tin zinc oxide (ITZO). In some embodiments, the first and second electrodes RME1 and RME2 may have a structure in which one or more layers of a transparent conductive material and one or more layers of a metal with high reflectance are stacked or may be formed as single layers including the transparent conductive material and the metal. For example, the first and second electrodes RME1 and RME2 may have a stack structure such as ITO/Ag/ITO, ITO/Ag/IZO, or ITO/Ag/ITZO/IZO.

The electrodes RME may be used to form an electric field in the first subpixel SPX1 to align the light-emitting elements ED. The light-emitting elements ED may be disposed between the first and second electrodes RME1 and RME2 by the electric field formed between the first and second electrodes RME1 and RME2. The light-emitting elements ED may be sprayed onto the electrodes RME via inkjet printing.

Once ink including the light-emitting elements ED is sprayed onto the electrodes RME, an electric field is formed by applying alignment signals to the electrodes RME. Suitable voltages (e.g., set or predetermined voltages) may be applied to the first and second electrodes RME1 and RME2 through the first and second voltage lines VL1 and VL2 such that the light-emitting elements ED may be aligned. Light-emitting elements ED dispersed in ink may receive a dielectrophoretic force from the electric field formed on the electrodes RME and may thus be aligned.

The electrodes RME of the first subpixel SPX1 and electrodes RME of the lower neighboring subpixel SPXn of the first subpixel SPX1) may be divided in the separation part ROP of the subarea SA of the first subpixel SPX1. This type of arrangement of the electrodes RME may be obtained by forming single electrode lines to extend in the second direction DR2 and dividing each of the electrode lines after the arrangement of light-emitting elements ED in each subpixel SPXn. The electrode lines may be used to form an electric field in each subpixel SPXn to align light-emitting elements ED in each subpixel SPXn during the fabrication of the display device 10. After the arrangement of light-emitting elements ED in each subpixel SPXn, a plurality of sets of first and second electrodes RME1 and RME2, which are spaced from one another in the second direction DR2, may be obtained by dividing the electrode lines in the separation part ROP of each subpixel SPXn.

The first insulating layer PAS1 may be disposed on the via layer VIA, the bank patterns BP, and the electrodes RME. The first insulating layer PAS1 may be disposed on the via layer VIA to cover the electrodes RME and the bank patterns BP. The first insulating layer PAS1 may be disposed in the subarea SA, but not in the separation part ROP where the electrodes RME are separated from other electrodes RME. The first insulating layer PAS1 may protect the electrodes RME and may insulate the electrodes RME from other electrodes RME. Also, the first insulating layer PAS1 may prevent the light-emitting elements ED from being in direct contact with, and damaged by, other members.

The first insulating layer PAS1 may be formed to be recessed in part between the electrodes RME, which are spaced from each other in the first direction DR1. An array of light-emitting elements ED may be disposed on portion of the top surface of the first insulating layer PAS1 that is recessed, and an empty space may be formed between the first insulating layer PAS1 and the array of light-emitting elements ED.

The bank BNL may be disposed on the first insulating layer PAS1. The bank BNL may include parts that extend in the first direction DR1 and parts that extend in the second direction DR2 and may thus be arranged in a lattice pattern in a plan view. The bank BNL may be disposed along the boundaries of the first subpixel SPX1 to separate the first subpixel SPX1 from other neighboring subpixels SPXn. Also, the bank BNL may be disposed to be around (or surround) the emission area EMA and the subarea of the first subpixel SPX1, and areas that are defined and opened by the bank BNL may be the emission area EMA and the subarea SA of the first subpixel SPX1.

The bank BNL may have a suitable height (e.g., a set or predetermined height). In some embodiments, the height of the bank BNL may be greater than the height of the bank patterns BP in the third direction DR3, and the thickness of the bank BNL may be the same as, or greater than, the thickness of the bank patterns BP. However, the present disclosure is not limited to this. Alternatively, the height of the bank BNL may be the same as, or smaller than, the height of the bank patterns BP in the third direction DR3. The bank BNL may prevent ink from spilling over from one subpixel SPXn to another subpixel SPXn during inkjet printing as performed during the fabrication of the display device 10. The bank BNL may prevent ink having different groups of light-emitting elements ED for different subpixels SPXn from being mixed together. The bank BNL, like the bank patterns BP, may include polyamide (PI), but the present disclosure is not limited thereto.

The light-emitting elements ED may be disposed on the first insulating layer PAS1. Each of the light-emitting elements ED may include a plurality of layers that are arranged in a direction parallel to the top surface of the substrate SUB. The light-emitting elements ED may be arranged such that a direction in which the light-emitting elements ED extend may be parallel to the substrate SUB, and the semiconductor layers included in each of the light-emitting elements ED may be sequentially arranged along a direction parallel to the top surface of the substrate SUB. However, the present disclosure is not limited to this. Alternatively, the plurality of layers included in each of the light-emitting elements ED may be arranged along a direction perpendicular to the substrate SUB.

A plurality of light-emitting elements ED may be disposed to be spaced from one another in the direction in which the electrodes RME extend, i.e., in the second direction DR2, and may be aligned substantially in parallel to one another. The light-emitting elements ED may extend in one direction, and the direction in which the light-emitting elements ED extend may form a substantially right angle with the direction in which the electrodes RME extend. However, the present disclosure is not limited to this. The light-emitting elements ED may be arranged diagonally (rather than perpendicularly) with respect to the direction in which the electrodes RME extend.

Light-emitting layers 36 (e.g., see FIG. 9) of light-emitting elements ED of one subpixel SPXn may include a different material from light-emitting layers 36 of an array of light-emitting elements ED of another subpixel SPXn so that the subpixels SPXn may emit light of different wavelength ranges. As a result, the first, second, and third subpixels SPX1, SPX2, and SPX3 of FIG. 3 may emit light of the first, second, and third colors, respectively. However, the present disclosure is not limited to this. Alternatively, the subpixels SPXn of the pixel PX of FIG. 3 may include arrays of light-emitting elements ED of the same type and may thus emit light of substantially the same color.

Both end portions of each of the light-emitting elements ED may be disposed between the electrodes RME to overlap the electrodes RME, between the bank patterns BP. The length of the light-emitting elements ED may be greater than the distance between the first and second electrodes RME1 and RME2, and both end portions of each of the light-emitting elements ED may be disposed on the first and second electrodes RME1 and RME2. For example, first end portions of the light-emitting elements ED may be placed on the first electrode RME1, and second end portions of the light-emitting elements ED may be placed on the second electrode RME2.

Both end portions of each of the light-emitting elements ED may be in contact with the connecting electrodes CNE. For example, a semiconductor layer 31 or 32 (e.g., see FIG. 9) or an electrode layer 37 (e.g., see FIG. 9) may be partially exposed on one end surface of each of the light-emitting elements ED, and the exposed semiconductor layer or the exposed electrode layer may be in contact with one of the connecting electrodes CNE. However, the present disclosure is not limited to this example. In one or more embodiments, at least portions of insulating films 38 (e.g., see FIG. 9) of the light-emitting elements ED may be removed so that side surfaces of semiconductor layers 31 or 32 of the light-emitting elements ED may be partially exposed. The exposed side surfaces of the semiconductor layers 31 or 32 may be in direct contact with the connecting electrodes CNE.

The second insulating layer PAS2 may be disposed in part on the light-emitting elements ED. For example, the second insulating layer PAS2 may be disposed on the light-emitting elements ED to be around (or surround) the outer surface (e.g., the outer peripheral or circumferential surface) of the light-emitting elements ED, and the width of the second insulating layer PAS2 may be smaller than the length of the light-emitting elements ED so that both end portions of each of the light-emitting elements may be exposed. During the fabrication of the display device 10, the second insulating layer PAS2 may be initially formed to cover the light-emitting elements ED, the electrodes RME, and the first insulating layer PAS1 and may be patterned later to expose both end portions of each of the light-emitting elements ED. The second insulating layer PAS2 may extend in the second direction DR2, on the first insulating layer PAS1 and the light-emitting elements ED, in a plan view and may thus form a linear or island pattern in the first subpixel SPX1. The second insulating layer PAS2 may protect and fix the light-emitting elements ED during the fabrication of the display device 10.

The connecting electrodes CNE may be disposed on the first insulating layer PAS1, the second insulating layer PAS2, and the light-emitting elements ED.

The connecting electrodes CNE may be disposed on the electrodes RME. The connecting electrodes CNE may include a first connecting electrode CNE1, which is disposed on the first electrode RME1, and a second connecting electrode CNE2, which is disposed on the second electrode RME2. The connecting electrodes CNE may be spaced from, and oppose (or face), each other, in the first direction DR1. For example, the first and second connecting electrodes CNE1 and CNE2 may be disposed on the first and second electrodes RME1 and RME2, respectively, to be spaced from each other in the first direction DR1.

The first connecting electrode CNE1 may include a first extension CN_E1, which extends in the second direction DR2 in the emission area EMA, a second extension CN_E2, which extends from the emission area EMA into the subarea SA, and a first connector CN_B1, which connects the first and second extensions CN_E1 and CN_E2. The first extension CN_E1 may overlap with the first electrode RME1 in the third direction DR3 and may be arranged in parallel to the first electrode RME1. The first connector CN_B1 may perpendicularly cross the first electrode RME1, in the emission area EMA, and may extend in the first direction DR1. The second extension CN_E2 may extend in the second direction DR2 to overlap with a portion of the bank BNL in the third direction DR3. The first connecting electrode CNE1 may generally extend in the second direction DR2 and may be bent once in the opposite direction of the first direction DR1 and extend back in the second direction DR2.

The second connecting electrode CNE2 may include a third extension CN_E3, which extends in the second direction DR2 in the emission area EMA, a fourth extension CN_E4, which extends from the emission area EMA into the subarea SA, and a second connector CN_B2, which connects the third and fourth extensions CN_E3 and CN_E4. The third extension CN_E3 may overlap with the second electrode RME2 in the third direction DR3 and may be arranged in parallel to the second electrode RME2. The second connector CN_B2 may perpendicularly cross the second electrode RME2, in the emission area EMA, and may extend in the first direction DR1. The fourth extension CN_E4 may extend in the second direction DR2 to overlap with a portion of the bank BNL in the third direction. The second connecting electrode CNE2 may generally extend in the second direction DR2 and may be bent once in the first direction DR1 and extend back in the second direction DR2.

The connecting electrodes CNE may be in contact with the light-emitting elements ED. The first connecting electrode CNE1 may be in contact with the first end portions of the light-emitting elements ED, and the second connecting electrode CNE2 may be in contact with the second end portions of the light-emitting elements ED. Semiconductor layers 31 or 32 or electrode layers 37 of the light-emitting elements ED may be exposed on either end surface of each of the light-emitting elements ED, and the connecting electrodes CNE may be in contact with, and electrically connected to, the semiconductor layers 31 or 32 or the electrode layers 37 of the light-emitting elements ED. Side surfaces of the connecting electrodes CNE that are in contact with both end portions of each of the light-emitting elements ED may be disposed on side surfaces of the second insulating layer PAS2. The first connecting electrode CNE1 may be disposed on one side surface of the second insulating layer PAS2, and the second connecting electrode CNE2 may be disposed on the other side surface of the second insulating layer PAS2.

The width of the connecting electrodes CNE may be smaller than the width of the electrodes RME in the first direction DR1. The connecting electrodes CNE may be in contact with both end portions of each of the light-emitting elements ED and may be disposed to cover portions of the top surfaces of the first and second electrodes RME1 and RME2, but the present disclosure is not limited thereto. Alternatively, the connecting electrodes CNE may be formed to have a larger width than the electrodes RME in the first direction DR1 and thus to cover both side surfaces of each of the electrodes RME.

The connecting electrodes CNE may include a transparent conductive material. For example, the connecting electrodes CNE may include ITO, IZO, ITZO, or Al. Light emitted from the light-emitting elements ED may travel in the upward direction through the connecting electrodes CNE, but the present disclosure is not limited thereto.

FIGS. 4 through 8 illustrate that two connecting electrodes are provided in the first subpixel SPX1, but the present disclosure is not limited thereto. That is, the number of connecting electrodes CNE provided in each subpixel SPXn may vary depending on the number of electrodes RME provided in each subpixel SPXn.

The first and second insulating layers PAS1 and PAS2 may include an inorganic insulating material or an organic insulating material. For example, the first and second insulating layers PAS1 and PAS2 may include an inorganic insulating material such as $SiO_x$, $SiN_x$, $SiO_xN_y$, aluminum oxide ($Al_xO_y$), or aluminum nitride (AlN). In one or more embodiments, the first and second insulating layers PAS1 and PAS2 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited to these examples.

A first bridge pattern BR1 may be provided to connect the first transistor T1 and the first connecting electrode CNE1 via the first conductive pattern CDP1, and a second bridge pattern BR2 may be provided to connect the second voltage line VL2 and the second connecting electrode CNE2.

Referring to FIGS. 4 through 8, the display device 10 may include the first and second bridge patterns BR1 and BR2 in the first subpixel SPX1.

The first bridge pattern BR1 may extend from the subarea SA of the first subpixel SPX1 to overlap with the bank BNL in the third direction DR3. The first bridge pattern BR1 may connect the first connecting electrode CNE1 and the first conductive pattern CDP1 of the first transistor T1. The first bridge pattern BR1 may be disposed on the left side of the first electrode RME1, in the subarea SA.

The first bridge pattern BR1 may include a first bridge extension BRE1, which is disposed in the subarea SA, and a second bridge extension BRE2, which extends in the second direction DR2 from the first bridge extension BRE1. The first bridge extension BRE1 may extend in the opposite direction of the first direction DR1 to overlap with the bank BNL in the third direction DR3. The second bridge extension BRE2 may completely overlap with the bank BNL in the third direction DR3 to extend in the second direction DR2. The first bridge pattern BR1 may extend in the opposite direction of the first direction DR1 and may be bent to extend in the second direction DR2.

The second bridge pattern BR2 may be disposed in the subarea SA of the first subpixel SPX1. The second bridge pattern BR2 may connect the second connecting electrode CNE2 and the second voltage line VL2. The second bridge pattern BR2 may be disposed on the right side of the second electrode RME2, in the subarea SA. The second bridge pattern BR2 may be formed as an island pattern.

The first and second bridge patterns BR1 and BR2 may be disposed on the first insulating layer PAS1, below the first and second connecting electrodes CNE1 and CNE2, respectively. The second bridge extension BRE2 of the first bridge pattern BR1 may be disposed below the bank BNL. The second bridge pattern BR2 may be disposed not to overlap with the bank BNL.

The first connecting electrode CNE1 may overlap with the first bridge pattern BR1, in the subarea SA. In the overlapping area of the first connecting electrode CNE1 and the first bridge pattern BR1, the first connecting electrode CNE1 and the first bridge pattern BR1 may be in direct contact with each other. For example, the first connecting electrode CNE1 may be formed directly on the top surface of the first bridge pattern BR1. The first bridge pattern BR1 may overlap with the first conductive pattern CDP1 of the first transistor T1, in the overlapping area of the first bridge pattern BR1 and the bank BNL. One end portion of the first bridge pattern BR1, for example, the second bridge extension BRE2, may be in contact with the first conductive pattern CDP1 through a first contact hole CT1, which penetrates the first insulating layer PAS1 and the via layer VIA. As a result, the first connecting electrode CNE1 may be electrically connected to the first conductive pattern CDP1 through the first bridge pattern BR1.

The second connecting electrode CNE2 may overlap with the second bridge pattern BR2, in the subarea SA. In the overlapping area of the second connecting electrode CNE2 and the second bridge pattern BR2, the second connecting electrode CNE2 and the second bridge pattern BR2 may be in direct contact with each other. For example, the second connecting electrode CNE2 may be formed directly on the top surface of the second bridge pattern BR2. The second bridge pattern BR2 may overlap with the second voltage line VL2, in the subarea SA. The second bridge pattern BR2 may be in direct contact with the second voltage line VL2 through a second contact hole CT2, which penetrates the first insulating layer PAS1 and the via layer VIA. As a result, the second connecting electrode CNE2 may be electrically connected to the second voltage line VL2 through the second bridge pattern BR2.

The first connecting electrode CNE1 may be electrically connected to the first conductive pattern CDP1 through the first bridge pattern BR1, and the second connecting electrode CNE2 may be electrically connected to the second voltage line VL2 through the second bridge pattern BR2.

As discussed above, in one or more embodiments, the electrodes RME may be formed of Al, and the connecting electrodes CNE may be formed of ITO. In a case where the electrodes RME are in direct contact with the connecting electrodes CNE, oxide films may be formed on the surfaces of the electrodes RME, and as a result, the contact resistance between the electrodes RME and the connecting electrodes CNE may increase. Also, a developing agent may infiltrate in subsequent processes, and as a result, a galvanic phenomenon may occur due to the standard reduction potential difference between Al and ITO, causing the lift-off or over-etching of films.

In the embodiment of FIGS. 4 through 8, as the first and second bridge patterns BR1 and BR2, which have a similar standard reduction potential to ITO and have excellent contact resistance, instead of the electrodes RME, which are formed of Al, are placed in contact with the connecting electrodes CNE, the contact resistance between the electrodes RME and the connecting electrodes CNE may be reduced, and a galvanic phenomenon may be prevented.

The first and second bridge patterns BR1 and BR2 may be formed of a material having a standard reduction potential difference of less than 0.5 V with ITO. For example, the first and second bridge patterns BR1 and BR2 may be formed of a metallic material having a standard reduction potential difference of ±0.5 V with ITO. The first and second bridge patterns BR1 and BR2 may include at least one of Mo, a Mo alloy, Ti, and a Ti alloy. Here, the Mo alloy may be Molybdenum-niobium (MoNb), but the present disclosure is not limited thereto. That is, any metallic material having a standard reduction potential difference of ±0.5 V with ITO may be used to form the first and second bridge patterns BR1 and BR2.

As the first and second connecting electrodes CNE1 and CNE2 are connected to the first conductive pattern CDP1 and the second voltage line VL2, respectively, via the first and second bridge patterns BR1 and BR2, respectively, the contact resistance between the first and second connecting electrodes CNE1 and CNE2 and the first and second bridge patterns BR1 and BR2 may be reduced. Also, as the first and second bridge patterns BR1 and BR2, which include a metal with a standard reduction potential difference of ±0.5 V with ITO, are placed in contact with the first and second connecting electrodes CNE1 and CNE2, a galvanic phenomenon may be prevented.

Figure 9:
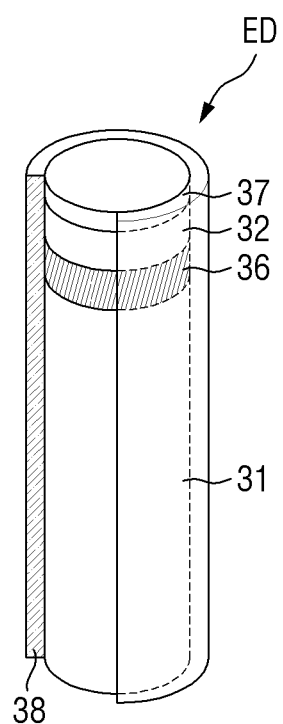
FIG. 9 is a perspective cutaway view of a light-emitting element according to one or more embodiments of the present disclosure.

FIG. 9 is a perspective cutaway view of a light-emitting element according to one or more embodiments of the present disclosure.

Referring to FIG. 9, a light-emitting element ED, which is a particulate device, may have a rod or cylindrical shape with a suitable aspect ratio (e.g., a set or predetermined aspect ratio). The light-emitting element ED may have a nanometer scale (e.g., a size of 1 nm to 1 μm) or a micrometer scale (e.g., a size of 1 μm to 1 mm) size. For example, an array of light-emitting elements ED may have a diameter and a length of nanometer scale or a diameter and a length of micrometer scale. In one or more embodiments, an array of light-emitting elements ED may have a diameter of nanometer scale and a length of micrometer scale. In one or more embodiments, some of an array of light-emitting elements ED may have a diameter and/or a length of nanometer scale, and the other light-emitting elements ED may have a diameter and/or a length of micrometer scale.

The light-emitting element ED may be an ILED. For example, the light-emitting element ED may include semiconductor layers doped with impurities of an arbitrary conductivity type (e.g., a p type or an n type). The semiconductor layers may receive electrical signals from an external power source to emit light of a particular wavelength range.

The light-emitting element ED may include a first semiconductor layer 31, an active layer 36, a second semiconductor layer 32, and an electrode layer 37, which are sequentially stacked in a lengthwise direction. The light-emitting element ED may further include an insulating film 38, which surrounds outer surfaces (e.g., outer peripheral or circumferential surfaces) of the first semiconductor layer 31, the second semiconductor layer 32, and the active layer 36.

The first semiconductor layer 31 may include an n-type semiconductor. In a case where the light-emitting element ED emits light of a blue wavelength range, the first semiconductor layer 31 may include a semiconductor material, i.e., $Al_xGa_yIn_{1-x-y}N$ (where $0 \leq x \leq 1$, $0 \leq y \leq 1$, and $0 \leq x+y \leq 1$). For example, the first semiconductor layer 31 may include at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length of 1.5 μm to 5 μm, but the present disclosure is not limited thereto.

The second semiconductor layer 32 may be disposed on a light-emitting layer 36. The second semiconductor layer 32 may include a p-type semiconductor. In a case where the light-emitting element ED emits light of a blue or green wavelength range, the second semiconductor layer 32 may include a semiconductor material, i.e., $Al_xGa_yIn_{1-x-y}N$ (where $0 \leq x \leq 1$, $0 \leq y \leq 1$, and $0 \leq x+y \leq 1$). For example, the second semiconductor layer 32 may include at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length of 0.05 μm to 0.10 μm, but the present disclosure is not limited thereto.

FIG. 9 illustrates that the first and second semiconductor layers 31 and 32 are formed as single layers, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 is disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN or AlGaInN. For example, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. For example, in a case where the light-emitting layer 36 includes AlGaInN as its quantum layer(s) and AlInN as its well layer(s), the light-emitting layer 36 may emit blue light having a central wavelength range of 450 nm to 495 nm.

However, the present disclosure is not limited to this. Alternatively, the light-emitting layer 36 may have a structure in which a semiconductor material having a large band gap energy and a semiconductor material having a small band gap energy are alternately stacked or may include Group-III or Group-V semiconductor materials depending on the wavelength of light to be emitted. The type of light emitted by the light-emitting layer 36 is not particularly limited. The light-emitting layer 36 may emit light of a red or green wavelength range as necessary, instead of blue light. The light-emitting layer 36 may have a length of 0.05 μm to 0.10 μm, but the present disclosure is not limited thereto.

Light may be emitted not only from the surface (e.g., peripheral or circumferential surface), in a length direction, of the light-emitting element ED, but also from both sides of the light-emitting element ED. The directionality of the light emitted from the light-emitting layer 36 is not particularly limited.

The electrode layer 37 may be an ohmic connecting electrode, but the present disclosure is not limited thereto. Alternatively, the electrode layer 37 may be a Schottky connecting electrode. The light-emitting element ED may include at least one electrode layer 37. FIG. 9 illustrates that the light-emitting element ED includes one electrode layer 37, but the present disclosure is not limited thereto. Alternatively, the light-emitting element ED may include more than one electrode layer 37, or the electrode layer 37 may not be provided. However, the following description of the light-emitting element ED may also be directly applicable to a light-emitting element ED having more than one electrode layer 37 or having a different structure from the light-emitting element ED of FIG. 9.

The electrode layer 37 may reduce the resistance between the light-emitting element ED and electrodes RME (or connecting electrodes CNE) when the light-emitting element ED is electrically connected to the electrodes RME (or the connecting electrodes CNE). The electrode layer 37 may include a conductive metal. For example, the electrode layer 37 may include at least one of Al, Ti, In, gold (Au), Ag, ITO, IZO, and ITZO. Also, the electrode layer 37 may include a semiconductor material doped with an n- or p-type dopant, but the present disclosure is not limited to this.

The insulating film 38 may be disposed to be around (or surround) the first and second semiconductor layers 31 and 32 and the electrode layer 37. For example, the insulating film 38 may be disposed to be around (or surround) at least the light-emitting layer 36 and may extend in the direction in which the light-emitting element ED extends. The insulating film 38 may protect the first semiconductor layer 31, the light-emitting layer 36, the second semiconductor layer 32, and the electrode layer 37. For example, the insulating film 38 may be formed to be around (or surround) the sides of the first semiconductor layer 31, the light-emitting layer 36, the second semiconductor layer 32, and the electrode layer 37, but to expose both end portions, in the length direction, of the light-emitting element ED.

FIG. 9 illustrates that the insulating film 38 is formed to extend in the length direction of the light-emitting element ED and to cover the sides of the first semiconductor layer 31, the light-emitting layer 36, the second semiconductor layer 32, and the electrode layer 37, but the present disclosure is not limited thereto. The insulating film 38 may cover the sides of only the light-emitting layer 36 and some of the first and second semiconductor layers 31 and 32 or may cover only portion of the side of the electrode layer 37 so that the side of the electrode layer 37 may be partially exposed. The insulating film 38 may be formed to be rounded in a cross-sectional view, in a region adjacent to at least one end of the light-emitting element ED.

The insulating film 38 may have a thickness of 10 nm to 1.0 μm, but the present disclosure is not limited thereto. In one or more embodiments, the insulating film 38 may have a thickness of about 40 nm.

The insulating film 38 may include a material with insulating properties such as, for example, silicon oxide ($SiO_x$), silicon nitride ($SiN_x$), silicon oxynitride ($SiO_xN_y$), aluminum nitride (AlN), or aluminum oxide ($Al_xO_y$). The insulating film 38 may prevent any short circuit that may occur when the light-emitting layer 36 is placed in direct contact with electrodes that transmit electrical signals directly to the light-emitting element ED. Also, because the insulating film 38 is around the light-emitting layer 36 to protect the outer surface (e.g., the outer peripheral or circumferential surface) of the light-emitting element ED, any degradation in the emission efficiency of the light-emitting element ED may be prevented.

The outer surface (e.g., the outer peripheral or circumferential surface) of the insulating film 38 may be subjected to surface treatment. The light-emitting element ED may be sprayed on electrodes while being scattered in ink (e.g., set or predetermined ink). Here, the surface of the insulating film 38 may be hydrophobically or hydrophilically treated to keep the light-emitting element ED scattered in ink without agglomerating with other neighboring light-emitting elements ED. For example, the insulating film 38 may be surface-treated with a material such as stearic acid or 2,3-naphthalene dicarboxylic acid.

Figure 10:
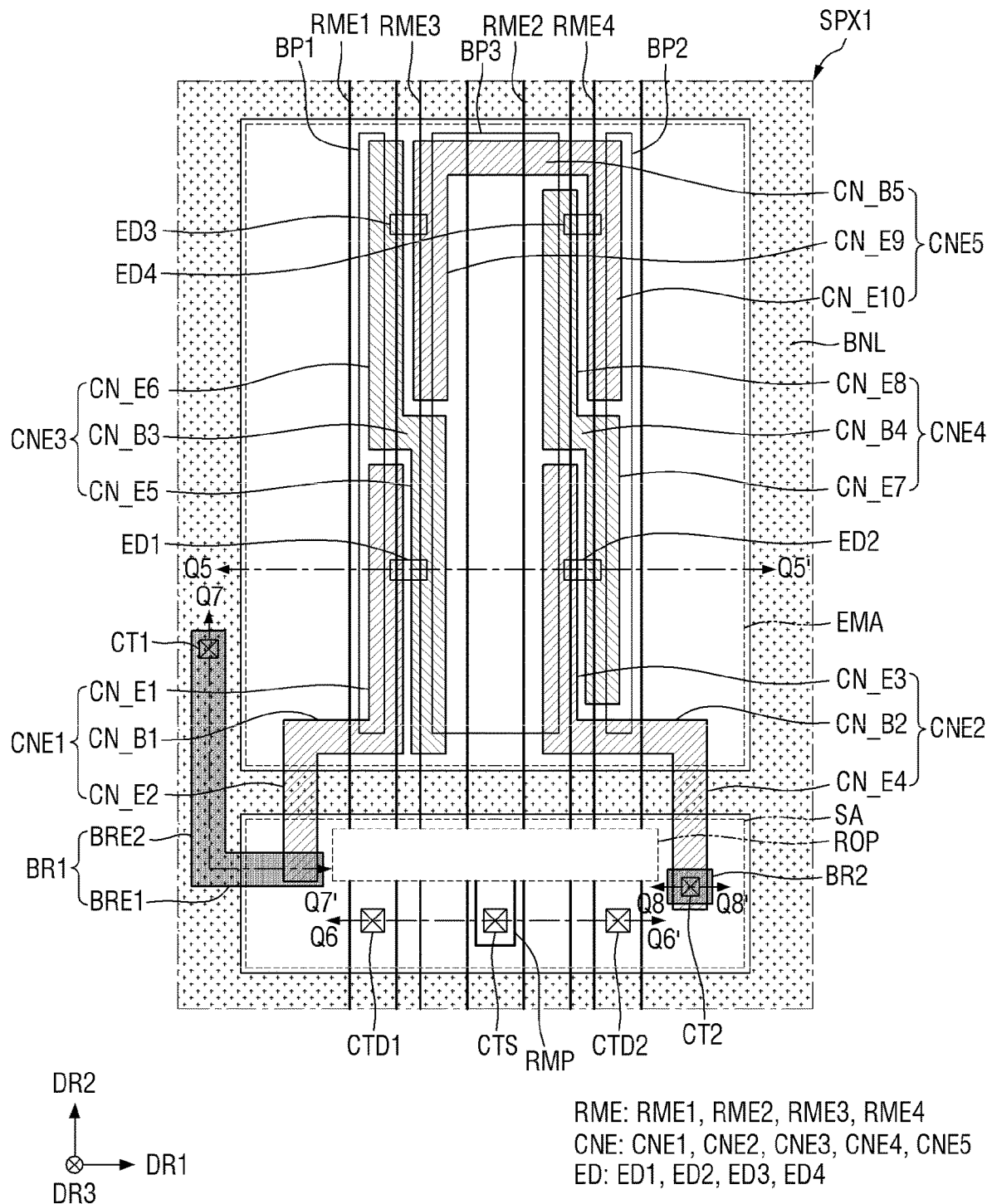
FIG. 10 is a plan view of a first subpixel according to one or more embodiments of the present disclosure.
Figure 11:
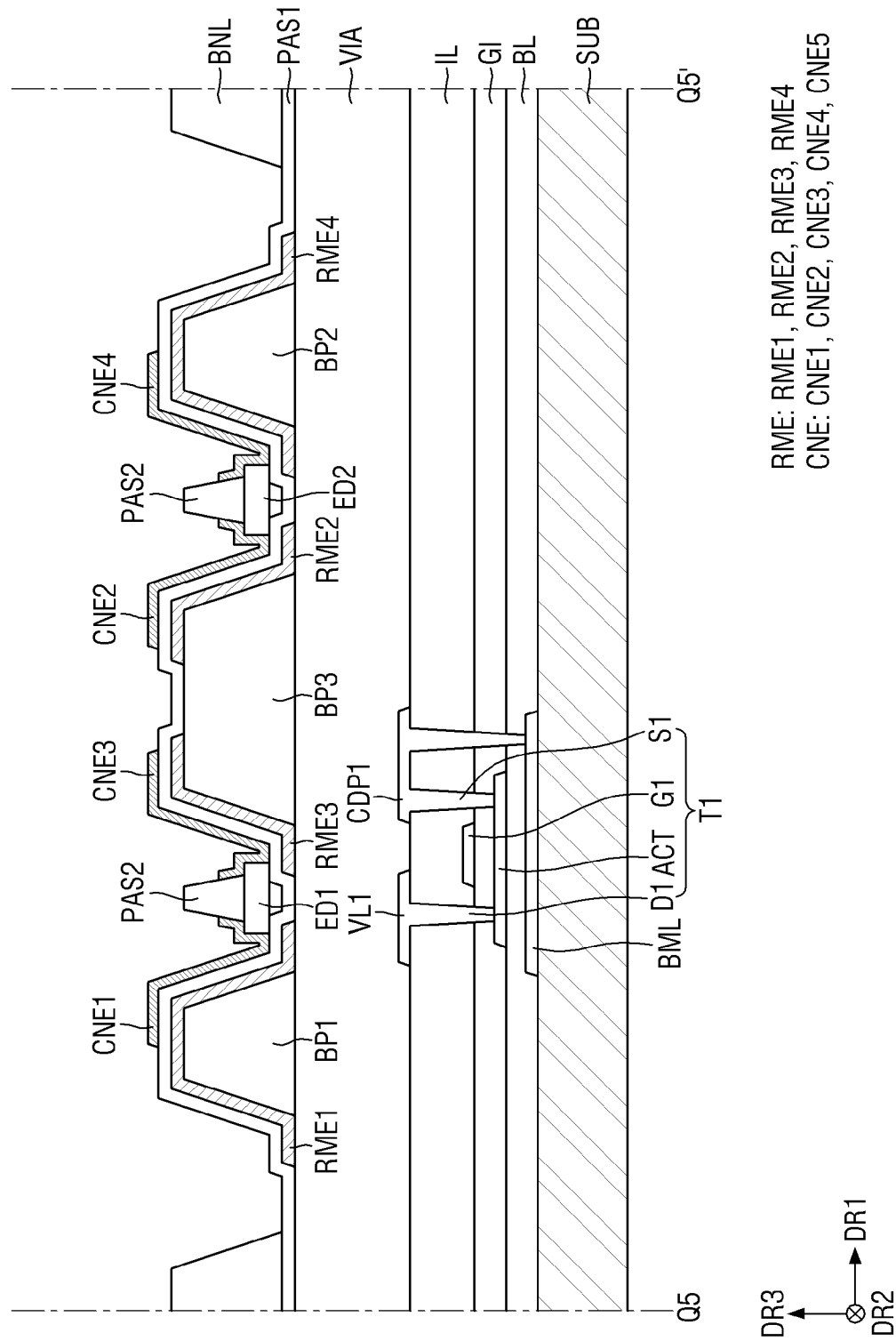
FIG. 11 is a cross-sectional view taken along the line Q5-Q5' of FIG. 10.
Figure 12:
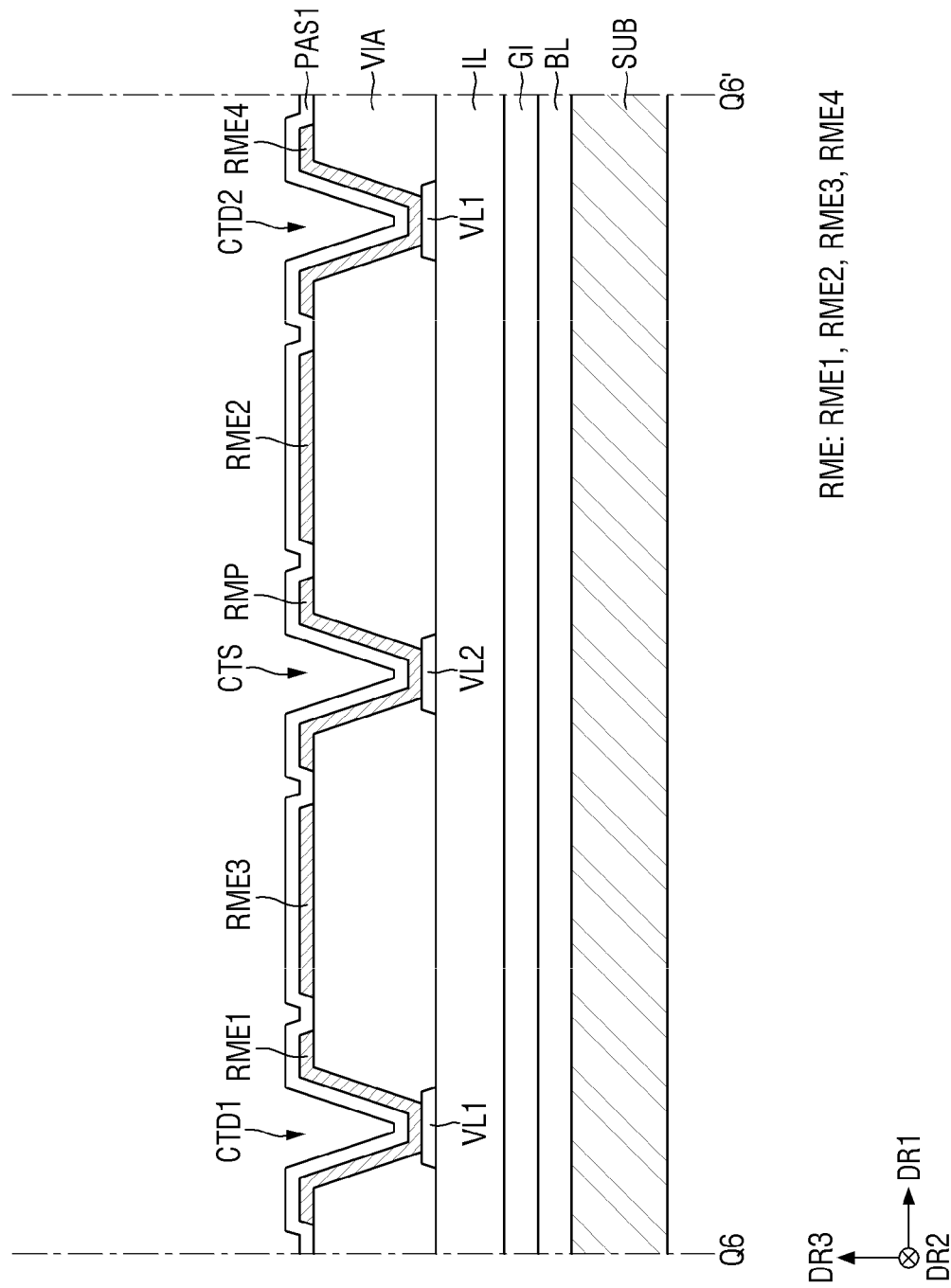
FIG. 12 is a cross-sectional view taken along the line Q6-Q6' of FIG. 10.
Figure 13:
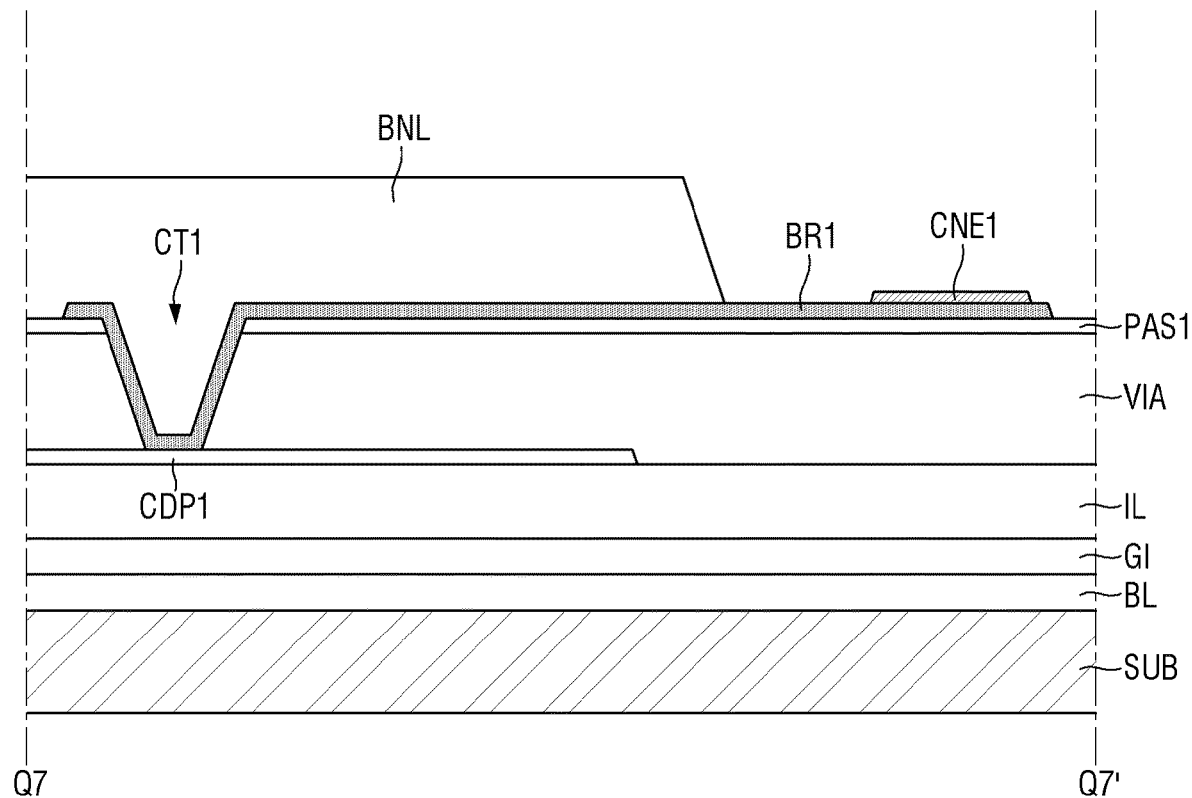
FIG. 13 is a cross-sectional view taken along the line Q7-Q7' of FIG. 10.
Figure 13:
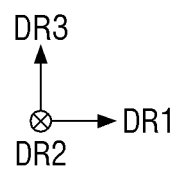
Figure 14:
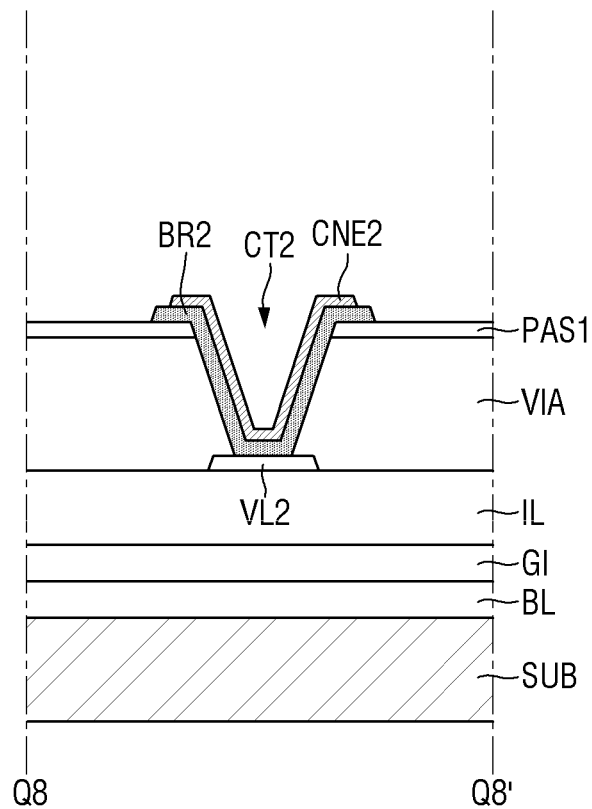
FIG. 14 is a cross-sectional view taken along the line Q8-Q8' of FIG. 10.

FIG. 10 is a plan view of a first subpixel according to one or more embodiments of the present disclosure. FIG. 11 is a cross-sectional view taken along the line Q5-Q5' of FIG. 10. FIG. 12 is a cross-sectional view taken along the line Q6-Q6' of FIG. 10. FIG. 13 is a cross-sectional view taken along the line Q7-Q7' of FIG. 10. FIG. 14 is a cross-sectional view taken along the line Q8-Q8' of FIG. 10.

Referring to a first subpixel SPX1 of FIGS. 10 through 14, the numbers of electrodes RME and connecting electrodes CNE provided in each subpixel SPXn may be increased, and the number of light-emitting elements ED provided in each subpixel SPXn may also be increased. The embodiment of FIGS. 10 through 14 differs from the embodiment of FIGS. 3 through 8 in electrodes RME, connecting electrodes CNE, and bank patterns BP and thus will hereinafter be described, focusing mainly on the differences with the embodiment of FIGS. 3 through 8.

Bank patterns BP1, BP2, and BP3 may be disposed on a via layer VIA. The bank patterns BP may include a first bank pattern BP1, a second bank pattern BP2, and a third bank pattern BP3, which is disposed between the first and second bank patterns BP1 and BP2.

The first bank pattern BP1 may be disposed on the left side of the center of an emission area EMA, the second bank pattern BP2 may be disposed on the right side of the center of the emission area EMA, and the third bank pattern BP3 may be disposed at the center of the emission area EMA. The third bank pattern BP3 may have a larger width in a first direction DR1 than the first and second bank patterns BP1 and BP2. The distance, in a first direction DR1, between the bank patterns BP may be greater than the distance, in the first direction DR1, between electrodes RME. As a result, at least portions of the electrodes RME may not overlap with the bank patterns BP.

The electrodes RME may include first and second electrodes RME1 and RME2 and may further include third and fourth electrodes RME3 and RME4.

The third electrode RME3 may be disposed between the first and second electrodes RME1 and RME2, and the fourth electrode RME4 may be spaced from the third electrode RME3 in the first direction DR1 with the second electrode RME2 interposed therebetween. The electrodes RME may be arranged in the order of the first, third, second, and fourth electrodes RME1, RME3, RME2, and RME4 along a left-to-right direction.

The electrodes RME may extend from the emission area EMA to a subarea SA, across a bank BNL. The first electrode RME1 may be connected to a first voltage line VL1 through a (1-1)-th electrode contact hole CTD1. The second and third electrodes RME2 and RME3 may be connected to a second voltage line VL2 through a second electrode contact hole CTS via a ramp RMP. The second and third electrodes RME2 and RME3 may be connected to each other in the subarea SA and may thus be connected in common to the second voltage line VL2, in the second electrode contact hole CTS. The fourth electrode RME4 may be connected to the first voltage line VL1 through a (1-2)-th electrode contact hole CTD2.

The electrodes RME may be separated from other electrodes RME of an adjacent subpixel SPXn, in the second direction DR2, in a separation part ROP of the subarea SA. The electrodes RME are illustrated as being separated in the separation part ROP and not being connected to the (1-1)-th electrode contact hole CTD1, the (1-2)-th electrode contact hole CTD2, and the second electrode contact hole CTS. The electrodes RME may receive signals from the first and second voltage lines VL1 and VL2 through contact holes during the alignment of light-emitting elements ED and may be divided later in the separation part ROP after the alignment of the light-emitting elements ED.

A plurality of light-emitting elements ED may be disposed between the bank patterns BP or between the electrodes RME. Some of the light-emitting elements ED may be disposed between the first and third bank patterns BP1 and BP3, and some of the light-emitting elements ED may be disposed between the second and third bank patterns BP2 and BP3. The light-emitting elements ED may include first and third light-emitting elements ED1 and ED3, which are disposed between the first and third bank patterns BP1 and BP3, and second and fourth light-emitting elements ED2 and ED4, which are disposed between the second and third bank patterns BP2 and BP3. The first and third light-emitting elements ED1 and ED3 may be disposed on the first and third electrodes RME1 and RME3, and the second and fourth light-emitting elements ED2 and ED4 may be disposed on the second and fourth electrodes RME2 and RME4. The first and second light-emitting elements ED1 and ED2 may be disposed on the lower side of the emission area EMA, near the subarea SA, and the third and fourth light-emitting elements ED3 and ED4 may be disposed on the upper side of the emission area EMA. The light-emitting elements ED may be classified not by their locations in the emission area EMA, but by their relationships with connecting electrodes CNE. The first, second, third, and fourth light-emitting elements ED1, ED2, ED3, and ED4 may be connected to different sets of connecting electrodes CNE depending on the layout of the connecting electrodes CNE, and the light-emitting elements ED may be classified into different types according to which set of connecting electrodes CNE they are connected.

The connecting electrodes CNE may include first and second connecting electrodes CNE1 and CNE2, which are disposed on the first and second electrodes RME1 and RME2, respectively, and may further include a third connecting electrode CNE3, which is disposed on the first and third electrodes RME1 and RME3, a fourth connecting electrode CNE4, which is disposed on the second and fourth electrodes RME2 and RME4, and a fifth connecting electrode CNE5, which is disposed on the third and fourth electrodes RME3 and RME4.

The first and second connecting electrodes CNE1 and CNE2 may be the same as their respective counterparts of FIGS. 3 through 8, except that they are relatively short in the second direction DR2. The first and second connecting electrodes CNE1 and CNE2 may be disposed on the lower side of the center of the emission area EMA. The first and second connecting electrodes CNE1 and CNE2 may be disposed over the subarea SA and may be in contact with the first and second bridge patterns BR1 and BR2, which are formed in the subarea SA.

The third connecting electrode CNE3 may include a fifth extension CN_E5, which is disposed on the third electrode RME3, a sixth extension CN_E6, which is disposed on the first electrode RME1, and a third connector CN_B3, which connects the fifth and sixth extensions CN_E5 and CN_E6.

The fifth extension CN_E5 may be spaced from, and face, the first connecting electrode CNE1 in the first direction DR1, and the sixth extension CN_E6 may be spaced from, and face, the first connecting electrode CNE1 in the second direction DR2. The fifth extension CN_E5 may be disposed on the lower side of the emission area EMA, and the sixth extension CN_E6 may be disposed on the upper side of the emission area EMA. The third connector CN_B3 may be disposed in the middle of the emission area EMA, over the first and third electrodes RME1 and RME3. The third connecting electrode CNE3 may generally extend in the second direction DR2 and may be bent once in the first direction DR1 and extend back in the second direction DR2.

The fourth connecting electrode CNE4 may include a seventh extension CN_E7, which is disposed on the fourth electrode RME4, an eighth extension CN_E8, which is disposed on the second electrode RME2, and a fourth connector CN_B4, which connects the seventh and eighth extensions CN_E7 and CN_E8. The seventh extension CN_E7 may be spaced from, and face, the second connecting electrode CNE2 in the first direction DR1, and the eighth extension CN_E8 may be spaced from, and face, the second connecting electrode CNE2 in the second direction DR2. The seventh connecting electrode CN_E7 may be disposed on the lower side of the emission area EMA, and the eighth extension CN_E8 may be disposed on the upper side of the emission area EMA. The fourth connector CN_B4 may be disposed in the middle of the emission area EMA, over the second and fourth electrodes RME2 and RME4. The fourth connecting electrode CNE4 may generally extend in the second direction DR2 and may be bent once in the first direction DR1 and extend back in the second direction DR2.

The fifth connecting electrode CNE5 may include a ninth extension CN_E9, which is disposed on the third electrode RME3, a tenth extension CN_E10, which is disposed on the fourth electrode RME4, and a fifth connector CN_B5, which connects the ninth and tenth extensions CN_E9 and CN_E10. The ninth extension CN_E9 may be spaced from, and face, the sixth extension CN_E6 of the third connecting electrode CNE3 in the first direction DR1, and the tenth extension CN_E10 may be spaced from, and face, the eighth extension CN_E8 of the fourth connecting electrode CNE4 in the first direction DR1. The ninth and tenth connecting electrodes CN_E9 and CN_E10 may be disposed on the upper side of the emission area EMA, and the fifth connector CN_B5 may be disposed over the second, third, and fourth electrodes RME2, RME3, and RME4. The fifth connecting electrode CNE5 may be around (or surround) the eighth extension CN_E8 of the fourth connecting electrode CNE4 in a plan view.

The first and second connecting electrodes CNE1 and CNE2 may be first-type connecting electrodes in direct contact with a third conductive layer, and the third, fourth, and fifth connecting electrodes CNE3, CNE4, and CNE5 may be second-type connecting electrodes not directly connected to the third conductive layer.

As already mentioned above, the light-emitting elements ED may be classified into different types depending on which set of connecting electrodes CNE they are in contact with.

First end portions of the first and second light-emitting elements ED1 and ED2 may be in contact with first-type connecting electrodes, and second end portions of the first and second light-emitting elements ED2 may be in contact with second-type connecting electrodes. The first light-emitting element ED1 may be in contact with the first and third connecting electrodes CNE1 and CNE3, and the second light-emitting element ED2 may be in contact with the second and fourth connecting electrodes CNE2 and CNE4. First and second end portions of each of the third and fourth light-emitting elements ED3 and ED4 may both be in contact with second-type connecting electrodes. The third light-emitting element ED3 may be in contact with the third and fifth connecting electrodes CNE3 and CNE5, and the fourth light-emitting element ED4 may be in contact with the fourth and fifth connecting electrodes CNE4 and CNE5.

The light-emitting elements ED may be connected in series through the connecting electrodes CNE. As a relatively large number of light-emitting elements ED may be included in each subpixel SPXn and may be connected in series, the amount of light emitted per unit area may be further increased.

Referring to FIGS. 13 and 14 and further to FIG. 10, first and second bridge patterns BR1 and BR2 may be provided to connect a first transistor T1 and a first connecting electrode CNE1 and connect the second voltage line VL2 and the second connecting electrode CNE2.

The first bridge pattern BR1 may connect the first connecting electrode CNE1 and a first conductive pattern CDP1 of the first transistor T1. The second bridge pattern BR2 may connect the second connecting electrode CNE2 and the second voltage line VL2. The first and second bridge patterns BR1 and BR2 may be disposed on a first insulating layer PAS1, below the first and second connecting electrodes CNE1 and CNE2. A second bridge extension BRE2 of the first bridge pattern BR1 may be disposed below a bank BNL. The second bridge pattern BR2 may be disposed not to overlap with the bank BNL.

The first connecting electrode CNE1 may overlap with the first bridge pattern BR1, in the subarea SA, and may be in direct contact with a first bridge extension BRE1 of the first bridge pattern BR1. The first bridge pattern BR1 may be in contact with the first conductive pattern CDP1 through a first contact hole CT1, which penetrates the first insulating layer PAS1 and the via layer VIA. As a result, the first connecting electrode CNE1 may be electrically connected to the first conductive pattern CDP1 through the first bridge pattern BR1.

The second connecting electrode CNE2 may overlap with the second bridge pattern BR2, in the subarea SA, and may be in direct contact with the second bridge pattern BR2. The second bridge pattern BR2 may be in contact with the second voltage line VL2 through a second contact hole CT2, which penetrates the first insulating layer PAS1 and the via layer VIA. As a result, the second connecting electrode CNE2 may be electrically connected to the second voltage line VL2 through the second bridge pattern BR2.

In the embodiment of FIGS. 10 through 14, as the first and second bridge patterns BR1 and BR2, which have a similar standard reduction potential to ITO and have excellent contact resistance, instead of the electrodes RME, which are formed of Al, are placed in contact with the connecting electrodes CNE, the contact resistance between the electrodes RME and the connecting electrodes CNE may be reduced, and a galvanic phenomenon may be prevented.

Also, as the first and second connecting electrodes CNE1 and CNE2 are connected to the first conductive pattern CDP1 and the second voltage line VL2, respectively, via the first and second bridge patterns BR1 and BR2, respectively, the contact resistance between the first and second connecting electrodes CNE1 and CNE2 and the first and second bridge patterns BR1 and BR2 may be reduced. Also, as the first and second bridge patterns BR1 and BR2, which include a metal with a standard reduction potential difference of ±0.5 V with ITO, are placed in contact with the first and second connecting electrodes CNE1 and CNE2, a galvanic phenomenon may be prevented.

Figure 15:
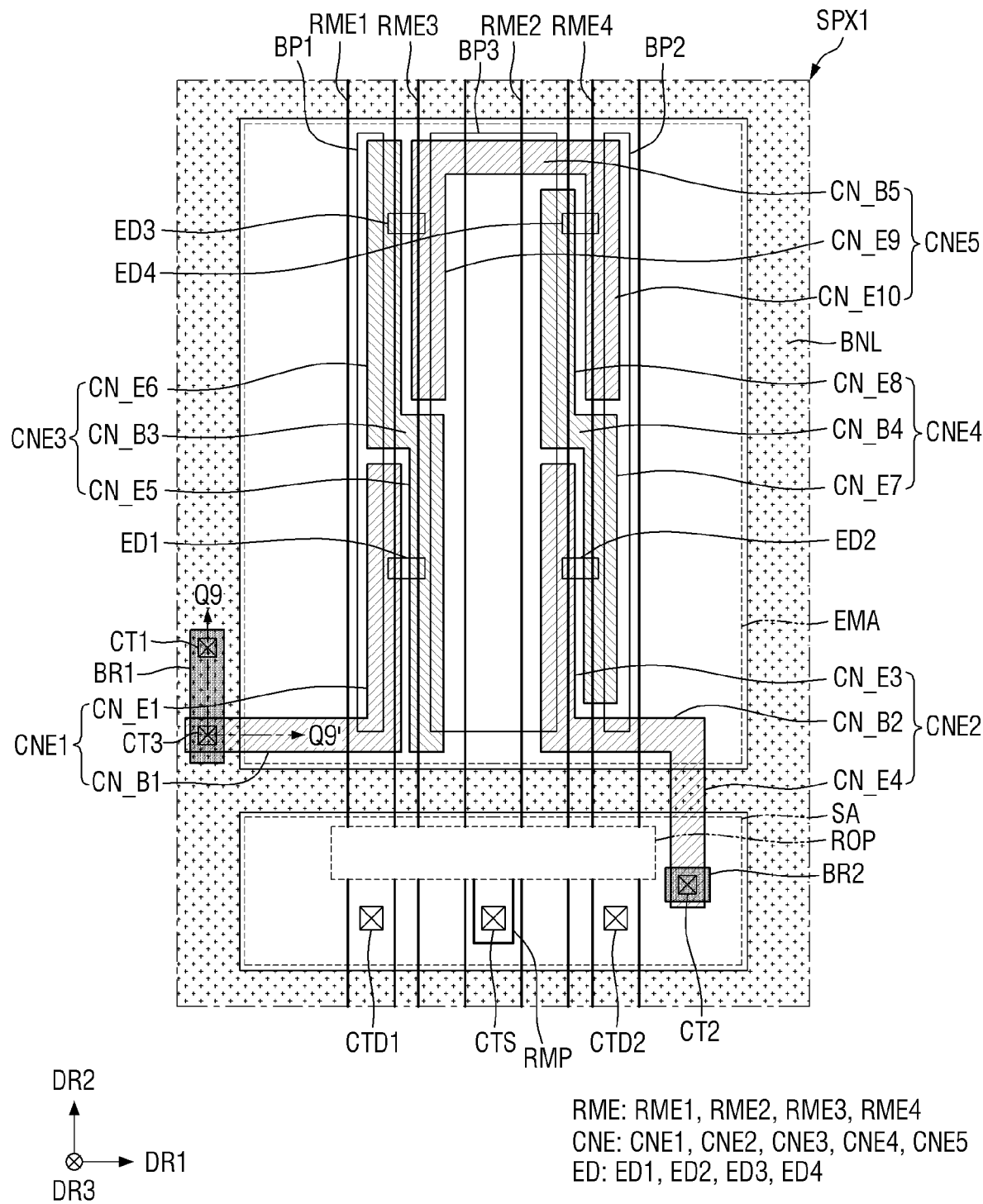
FIG. 15 is a plan view of a subpixel of a display device according to one or more embodiments of the present disclosure.
Figure 16:
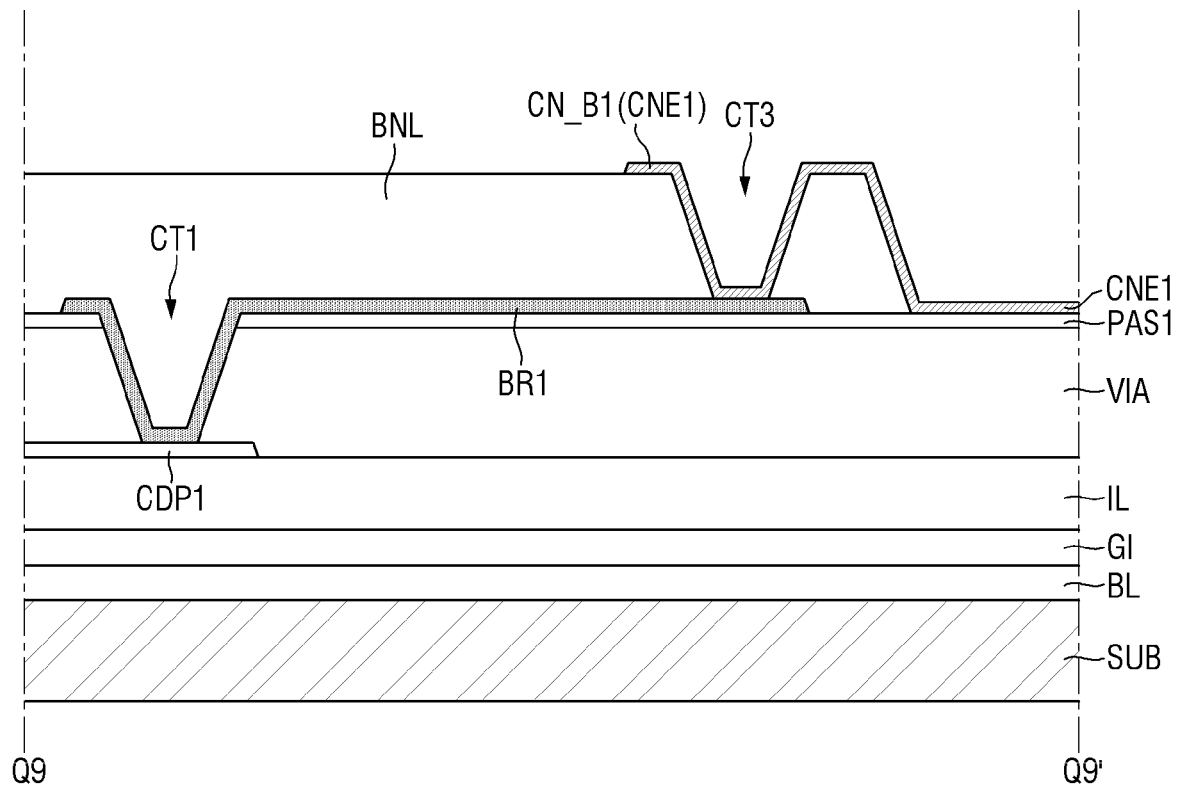
FIG. 16 is a cross-sectional view taken along the line Q9-Q9' of FIG. 15.

FIG. 15 is a plan view of a subpixel of a display device according to one or more embodiments of the present disclosure. FIG. 16 is a cross-sectional view taken along the line Q9-Q9' of FIG. 15.

The embodiment of FIGS. 15 and 16 differs from the embodiment of FIGS. 10 through 14 in the shapes of a first connecting electrode CNE1 and a first bridge pattern BR1, and thus will hereinafter be described, focusing mainly on the differences with the embodiment of FIGS. 10 through 14.

Referring to a first subpixel SPX1 of FIGS. 15 and 16, the first connecting electrode CNE1 may include a first extension CN_E1, which extends in a second direction DR2 in an emission area EMA, and a first connector CN_B1, which extends in the opposite direction of the first direction DR1 from the first extension CN_E1. The first connecting electrode CNE1 may differ from its counterpart of FIGS. 10 through 14 in that it does not include a second extension CN_E2, and that the first connector CN_B1 does not extend into a subarea SA. The first connector CN_B1 may extend in the opposite direction of the first direction DR1, in the emission area EMA, to overlap with a bank BNL, which is disposed in a non-emission area. The first connector CN_B1 may connect a first bridge pattern BR1, which overlaps with the bank BNL, and the first extension CN_E1. The first connector CN_B1 may overlap with the bank BNL, but not with the subarea SA. The first extension CN_E1 may not overlap with the first bridge pattern BR1. The first connecting electrode CNE1 may extend in the opposite direction of the second direction DR2 and may be bent in the opposite direction of the first direction DR1. The first connecting electrode CNE1 may extend on a first insulating layer PAS1, in the emission area EMA, and then over to the bank BNL and may thus be disposed on the bank BNL.

The first bridge pattern BR1 may be formed as an island pattern extending in the second direction DR2 and may overlap with the bank BNL. The first bridge pattern BR1 may be disposed not to overlap with the emission area EMA and the subarea SA. The first bridge pattern BR1 differs from its counterpart of FIGS. 10 through 14 in that it does not include a first bridge extension BRE1. The first bridge pattern BR1 may connect a first conductive pattern CDP1, which overlaps with the bank BNL, and the first connecting electrode CNE1. The first bridge pattern BR1 may be connected to the first conductive pattern CDP1 through a first contact hole CT1, which penetrates a via layer VIA and the first insulating layer PAS1. The first connecting electrode CNE1 may be connected to the first bridge pattern BR1 through a third contact hole CT3, which penetrates the bank BNL.

In the embodiment of FIGS. 15 and 16, as bends of the first connecting electrode CNE1 and the first bridge pattern BR1 may be reduced or minimized, the fabrication and patterning of a display device may be simplified and improved.

Figure 17:
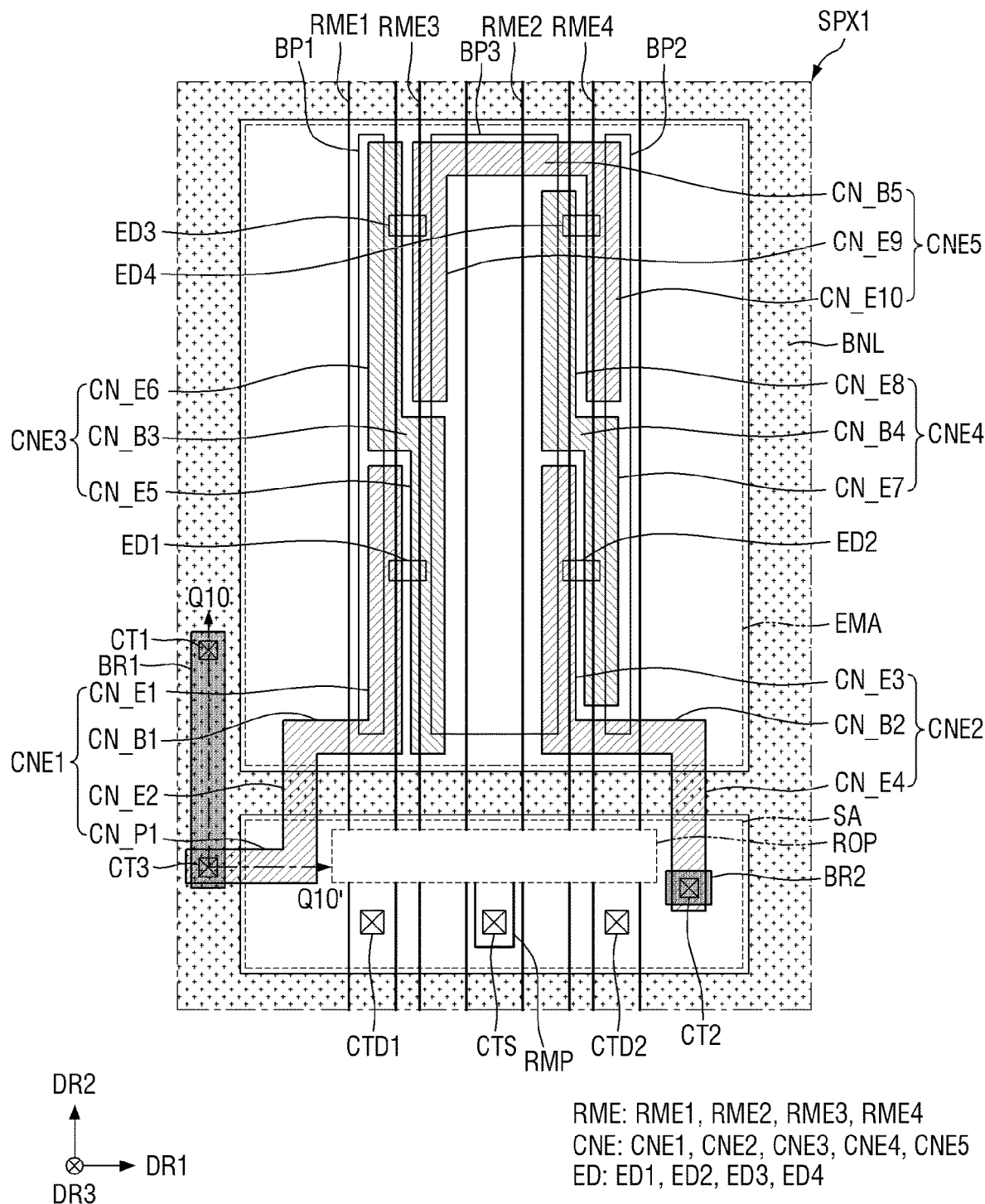
FIG. 17 is a plan view of a subpixel of a display device according to one or more embodiments of the present disclosure.
Figure 18:
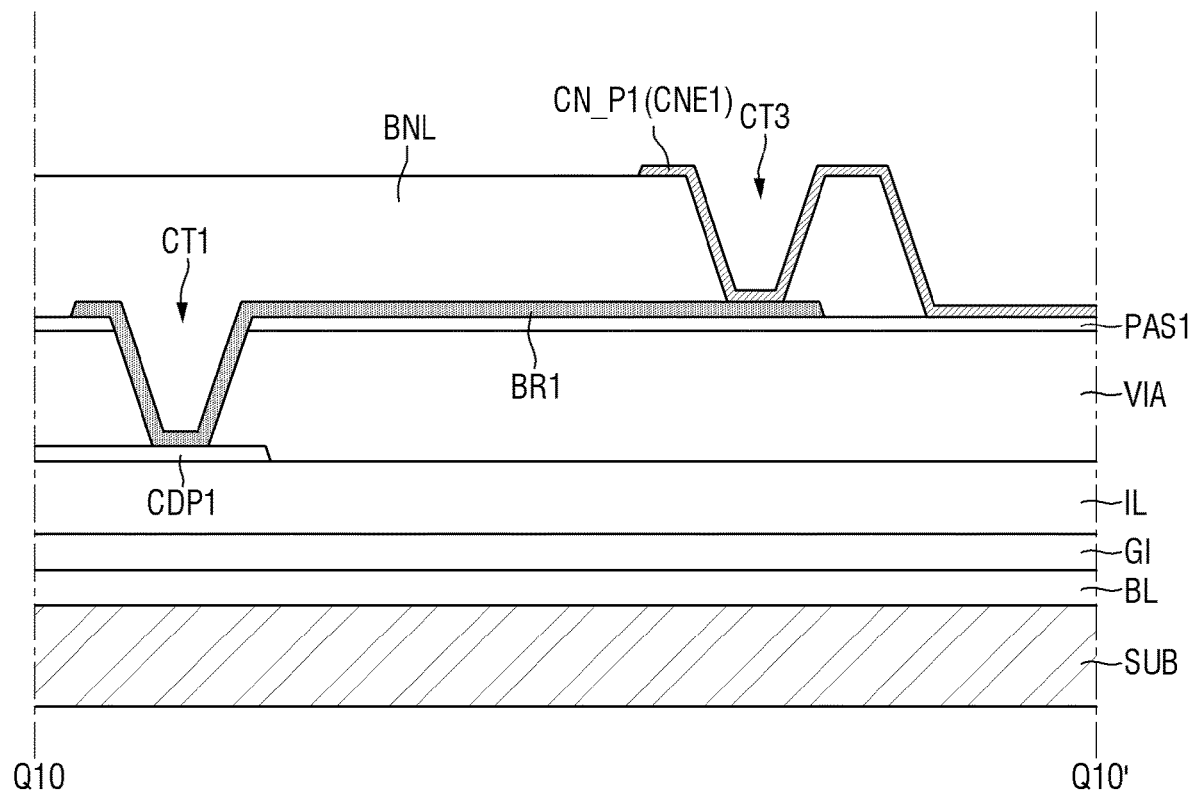
FIG. 18 is a cross-sectional view taken along the line Q10-Q10' of FIG. 17.
Figure 18:
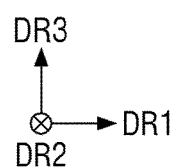

FIG. 17 is a plan view of a subpixel of a display device according to one or more embodiments of the present disclosure. FIG. 18 is a cross-sectional view taken along the line Q10-Q10' of FIG. 17.

The embodiment of FIGS. 17 and 18 differs from the embodiment of FIGS. 10 through 14 in the shapes of a first connecting electrode CNE1 and a first bridge pattern BR1, and thus will hereinafter be described, focusing mainly on the differences with the embodiment of FIGS. 10 through 14.

Referring to a first subpixel SPX1 of FIGS. 17 and 18, a first connecting electrode CNE1 may further include a first protrusion CN_P1, which extends in the opposite direction of a first direction DR1 from a first end of a second extension CN_E2. A first connector CN_B1 may be disposed at a second end of the second extension CN_E2, and the first protrusion CN_P1 may extend from the first end of the second extension CN_E2. The first protrusion CN_P1 may extend in the opposite direction of the first direction DR1 from a subarea SA to overlap with a bank BNL. The first protrusion CN_P1 may connect a first bridge pattern BR1, which overlaps with the bank BNL, and the first connecting electrode CNE1. The first protrusion CN_P1 may overlap with the subarea SA and the bank BNL, but not with an emission area EMA. The first protrusion CN_P1 may overlap with the first bridge pattern BR1, in an area that overlaps with the bank BNL. The first connecting electrode CNE1 may extend in the opposite direction of a second direction DR2, be bent in the opposite direction of the first direction DR1, extend back in the opposite direction of the second direction DR2, and be bent back in the opposite direction of the first direction DR1. The first connecting electrode CNE1 may extend on a first insulating layer PAS1, in the emission area EMA, and over to the bank BNL and may thus be disposed on the bank BNL.

The first bridge pattern BR1 may be formed as an island pattern extending in the second direction DR2 and may overlap with the bank BNL. The first bridge pattern BR1 may be the same as its counterpart of FIGS. 15 and 16 except that it is relatively long in the second direction DR2. The first bridge pattern BR1 may be connected to a first conductive pattern CDP1 through a first contact hole CT1, which penetrates a via layer VIA and the first insulating layer PAS1. The first connecting electrode CNE1 may be connected to the first bridge pattern BR1 through a third contact hole CT3, which penetrates the bank BNL.

Embodiments of the present disclosure will hereinafter be described in further detail with reference to the following preparation and experimental examples.

Preparation Example 1: Deposition of Metal and ITO

Sample #1 was prepared by depositing Al on a substrate to a thickness of 2000 Å and depositing ITO on the Al. Sample #2 was prepared by depositing Mo on a substrate to a thickness of 50 Å, depositing Al on the Mo to a thickness of 1000 Å, and depositing ITO on the Al. Sample #3 was prepared by depositing Al on a substrate to a thickness of 1000 Å, depositing Mo on the Al to a thickness of 50 Å, and depositing ITO on the Mo.

Experimental Example 1: Measurement of RC Resistances of Metal and ITO

Figure 19:
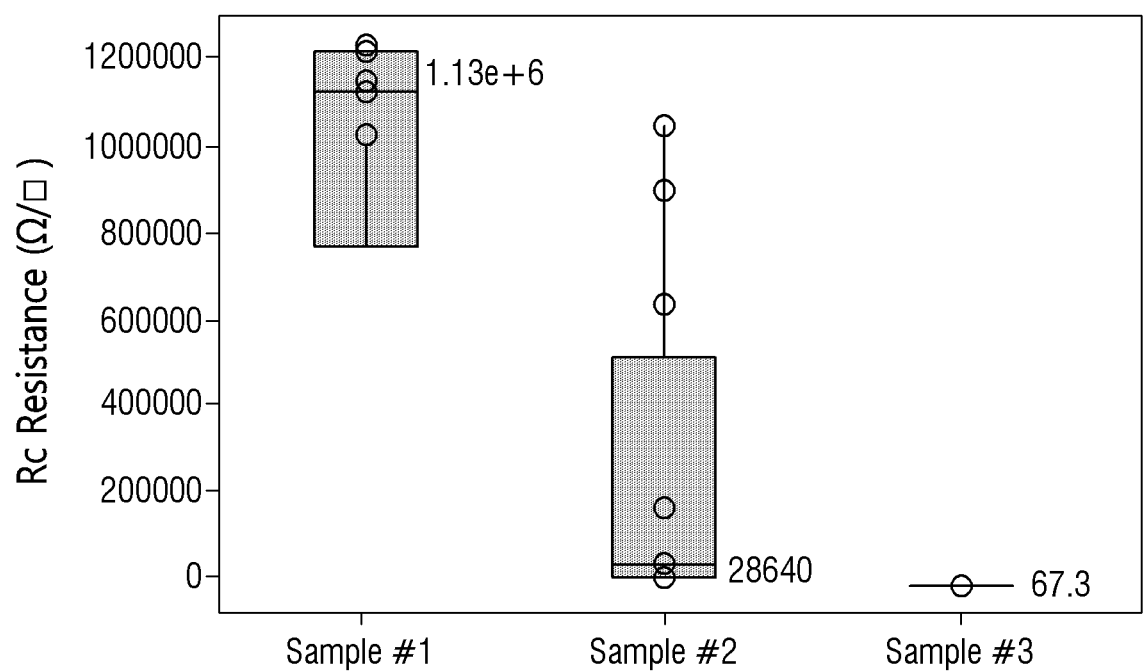
FIG. 19 is a graph showing the resistance-capacitance (RC) resistances of samples according to one or more embodiments (e.g., an experimental example 1)

The resistance-capacitance (RC) resistances of samples #1, #2, and #3 were measured, and the results of the measurement are as shown in FIG. 19. FIG. 19 is a graph showing the RC resistances of samples according to one or more embodiments (e.g., an experimental example 1). Values on the graph of FIG. 19 are the averages of RC resistance measurements.

Referring to FIG. 19, sample #1 has a highest RC resistance because of having Al in direct contact with ITO. Sample #2 has a lower RC resistance than sample #1 because of having ITO in contact with Al and having Mo added below the Al. Sample #3 has a lowest RC resistance because of having Mo in contact with ITO.

FIG. 19 shows that RC resistance may be considerably reduced by placing connecting electrodes formed of ITO with bridge patterns formed of Mo.

Preparation Example 2: Deposition of Cu and Metal

Sample #4 was prepared by depositing Cu on a substrate and depositing Al on the Cu to a thickness of 2000 Å. Sample #5 was prepared by depositing Cu on a substrate, depositing Mo on the Cu to a thickness of 50 Å, and depositing Al on the Mo to a thickness of 1000 Å. Sample #6 was prepared by depositing Cu on a substrate, depositing Al on the Cu to a thickness of 1000 Å, and depositing Mo on the Al to a thickness of 50 Å.

Experimental Example 2: Measurement of RC Resistances of Cu and Metal

Figure 20:
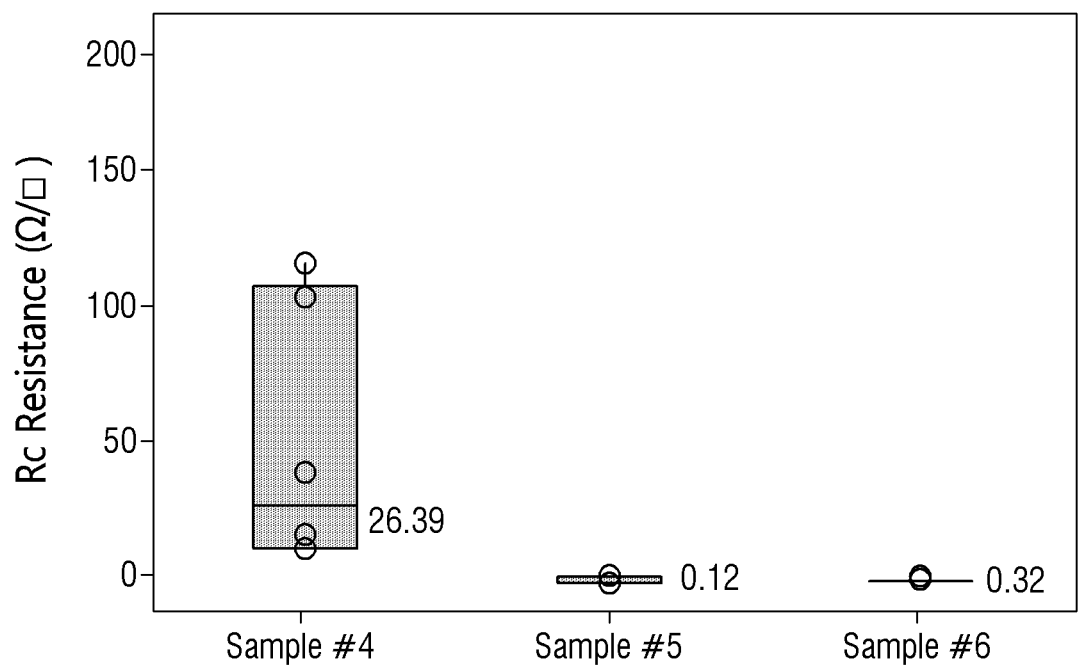
FIG. 20 is a graph showing the RC resistances of samples according to one or more embodiments (e.g., an experimental example 2).

The RC resistances of samples #4, #5, and #6 were measured, and the results of the measurement are as shown in FIG. 20. FIG. 20 is a graph showing the RC resistances of samples according to one or more embodiments (e.g., experimental example 2). Values on the graph of FIG. 20 are the averages of RC resistance measurements.

Referring to FIG. 20, sample #4 has a highest RC resistance because of having Al in direct contact with Cu. Sample #5 has a lowest RC resistance because of having Cu in contact with Mo and having Al added on the Mo. Sample #6 also has a low RC resistance because of having Cu in contact with Al and having Mo added on the Al.

FIG. 20 shows that RC resistance may be considerably reduced by placing a third conductive layer formed of Cu with bridge patterns formed of Mo.

In concluding the detailed description, those skilled in the art will appreciate that many variations and modifications may be made to the embodiments without substantially departing from the principles and scope of the present disclosure. Therefore, the embodiments of the present disclosure are used in a generic and descriptive sense only and not for purposes of limitation. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
    a transistor on a substrate;
    a via layer on the transistor;
    a first electrode and a second electrode on the via layer and arranged in parallel to each other;
    a first insulating layer on the first and second electrodes;
    a first bridge pattern on the first insulating layer and connected to the transistor;
    light-emitting elements having both end portions thereof on the first and second electrodes;
    a first connecting electrode connected to first end portions of the light-emitting elements;
    a second connecting electrode connected to second end portions of the light-emitting elements, and
    a bank surrounding an emission area, in which the light-emitting elements are located, and surrounding a subarea, which is spaced in one direction from the emission area, with at least a portion of the bank being between the emission area and the subarea,
    wherein the first connecting electrode is in contact with the first bridge pattern and is electrically connected to the transistor.

2. The display device of claim 1,
    wherein the bank defines the emission area, and
    wherein the first and second electrodes extend from the emission area to the subarea.

3. The display device of claim 1, further comprising:
    a second bridge pattern on the first insulating layer, in a subarea of the display device.

4. The display device of claim 3, further comprising:
    a first conductive pattern on the substrate and connected to the transistor;
    a first voltage line at a same layer as the first conductive pattern and connected to the first electrode; and
    a second voltage line at the same layer as the first voltage line and connected to the second electrode.

5. The display device of claim 4, wherein the first bridge pattern comprises a first bridge extension, which overlaps with the subarea and the bank of the display device, and a second bridge extension, which is bent, and extends, in one direction from the first bridge extension.

6. The display device of claim 5, wherein
    the first bridge extension of the first bridge pattern is in contact with the first connecting electrode, in the subarea, and the second bridge extension of the first bridge pattern is in contact with the first conductive pattern.

7. The display device of claim 6, wherein
the second bridge extension of the first bridge pattern is in contact with the first conductive pattern through a first contact hole, which penetrates the first insulating layer and the via layer, and
the second bridge pattern is in contact with the second voltage line through a second contact hole, which penetrates the first insulating layer and the via layer.

8. The display device of claim 6, wherein
the second connecting electrode and the second bridge pattern are in contact with each other in the subarea, and
the second bridge pattern is in contact with the second voltage line, in the subarea.

9. The display device of claim 3, wherein
the first connecting electrode comprises a first extension, which extends in one direction in an emission area of the display device, a second extension, which extends from the emission area to the subarea, and a first connector, which connects the first and second extensions, and
the second connecting electrode comprises a third extension, which extends in the one direction in the emission area, a fourth extension, which extends from the emission area to the subarea, and a second connector, which connects the third and fourth extensions.

10. The display device of claim 9, wherein
the second extension of the first connecting electrode is in contact with the first bridge pattern, and
the fourth extension of the second connecting electrode is in contact with the second bridge pattern.

11. The display device of claim 3, wherein the first and second bridge patterns comprise a metal having a standard reduction potential difference of 0.5 V or less with indium tin oxide (ITO).

12. The display device of claim 11, wherein the metal comprises at least one of molybdenum (Mo), a molybdenum alloy, titanium (Ti), and a titanium alloy.

13. The display device of claim 12, wherein
the first and second bridge patterns comprise a molybdenum-niobium (Nb) alloy, and
the first and second connecting electrodes comprise indium tin oxide.

14. A display device comprising:
a transistor on a substrate;
a first conductive pattern connected to the transistor;
at least one voltage line at a same layer as the first conductive pattern;
a via layer on the first conductive pattern and the at least one voltage line;
a first electrode and a second electrode on the via layer and arranged in parallel to each other;
a first insulating layer on the first and second electrodes;
a first bridge pattern on the first insulating layer and connected to the first conductive pattern;
a second bridge pattern on the first insulating layer and connected to the at least one voltage line;
light-emitting elements having both end portions thereof on the first and second electrodes;
a first connecting electrode connected to first end portions of the light-emitting elements;
a second connecting electrode connected to second end portions of the light-emitting elements, and
a bank surrounding an emission area, in which the light-emitting elements are located, and surrounding a subarea, which is spaced in one direction from the emission area, with at least a portion of the bank being between the emission area and the subarea,
wherein the first connecting electrode is connected to the first bridge pattern, and
wherein the second connecting electrode is connected to the second bridge pattern.

15. The display device of claim 14,
wherein the bank defines the emission area,
the first bridge pattern overlaps with the bank, but not with the emission area and the subarea, and
the second bridge pattern overlaps with the subarea, but not with the emission area and the bank.

16. The display device of claim 15, wherein
the first connecting electrode comprises a first extension, which extends in the one direction in the emission area, and a first connector, which extends from one end of the first extension to overlap with the bank, and
the first connector of the first connecting electrode is in contact with the first bridge pattern through a contact hole, which penetrates the bank.

17. The display device of claim 15, wherein
the first connecting electrode comprises a first extension, which extends in the one direction in the emission area, a second extension, which extends from the emission area to the subarea, and a first protrusion, which extends from one end of the second extension to overlap with the bank, and
the first protrusion of the first connecting electrode is in contact with the first bridge pattern through a contact hole, which penetrates the bank.

18. The display device of claim 14, wherein the first and second bridge patterns comprise a metal having a standard reduction potential difference of 0.5 V or less with indium tin oxide.

19. The display device of claim 14, further comprising:
a second insulating layer on the light-emitting elements, wherein
the first connecting electrode is on one side surface of the second insulating layer, and
the second connecting electrode is on an other side surface of the second insulating layer.

20. An electronic device comprising:
a transistor on a substrate;
a via layer on the transistor;
a first electrode and a second electrode on the via layer and arranged in parallel to each other;
a first insulating layer on the first and second electrodes;
a first bridge pattern on the first insulating layer and connected to the transistor;
light-emitting elements having both end portions thereof on the first and second electrodes;
a first connecting electrode connected to first end portions of the light-emitting elements;
a second connecting electrode connected to second end portions of the light-emitting elements, and
a bank surrounding an emission area, in which the light-emitting elements are located, and surrounding a subarea, which is spaced in one direction from the emission area, with at least a portion of the bank being between the emission area and the subarea,
wherein the first connecting electrode is in contact with the first bridge pattern and is electrically connected to the transistor.

* * * * *